US012710480B2

(12) United States Patent
Li et al.

(10) Patent No.: US 12,710,480 B2

(45) Date of Patent: Aug. 18, 2026

(54) SYSTEMS AND METHODS FOR BATTERY PERFORMANCE MONITORING AND MANAGEMENT USING DISCRETE-TIME STATE-SPACE OVERPOTENTIAL BATTERY MODELS

(71) Applicant: The Trustees of Columbia University in the City of New York, New York, NY (US)

(72) Inventors: Alan Gen Li, New York, NY (US); Matthias Preindl, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 156 days.

(21) Appl. No.: 18/376,581

(22) Filed: Oct. 4, 2023

(65) Prior Publication Data

US 2024/0125862 A1 Apr. 18, 2024

Related U.S. Application Data

(60) Provisional application No. 63/412,956, filed on Oct. 4, 2022.

(51) Int. Cl.

| | |
|---|---|
| ***G01R 31/388*** | (2019.01) |
| ***G01R 31/36*** | (2020.01) |
| ***G01R 31/392*** | (2019.01) |
| ***H01M 10/0525*** | (2010.01) |
| ***H01M 10/42*** | (2006.01) |

(52) U.S. Cl.

CPC ....... *G01R 31/388* (2019.01); *G01R 31/3648* (2013.01); *G01R 31/392* (2019.01); *H01M 10/0525* (2013.01); *H01M 10/4285* (2013.01)

(58) Field of Classification Search

CPC .......................... G01R 31/388; G01R 31/392; G01R 31/3648; H01M 10/0525; H01M 10/4285

USPC ........................................................ 702/182

See application file for complete search history.

(56) References Cited

U.S. PATENT DOCUMENTS

| | | | | |
|---|---|---|---|---|
| 9,077,182 B2 * | 7/2015 | Wang | .................. | G01R 31/367 |
| 9,658,291 B1 * | 5/2017 | Wang | ................ | G01R 31/3842 |
| 9,726,732 B2 * | 8/2017 | Lin | .................... | G01R 31/3842 |
| 9,960,625 B2 * | 5/2018 | Klein | ..................... | B60L 58/10 |

(Continued)

OTHER PUBLICATIONS

Mayilvahanan et al., "Understanding Evolution of Lithium Trivanadate Cathodes During Cycling via Reformulated Physics-Based Models and Experiments," Journal of the Electrochemical Society, vol. 168, p. 050525, 2021.

(Continued)

*Primary Examiner* — Zhen Y Wu

(74) *Attorney, Agent, or Firm* — Potomac Law Group, PLLC

(57) ABSTRACT

Disclosed are systems, methods, and other implementations, including a method for monitoring and managing battery performance that includes deriving a representation of diffusion overpotential behavior for a lithium-ion battery according to a discrete-time state-space approximation of a convolution-defined diffusion (CDD) model for the lithium-ion battery, and determining behavior of the lithium-ion battery according to the discrete-time state-space approximation of the convolution-defined diffusion (CDD) model for the lithium-ion battery.

21 Claims, 13 Drawing Sheets

100

(56) References Cited

U.S. PATENT DOCUMENTS

| | | | | |
|---|---|---|---|---|
| 10,099,562 | B2 * | 10/2018 | Jin | G01R 31/382 |
| 10,191,117 | B2 * | 1/2019 | Imaizumi | G01R 31/367 |
| 10,511,050 | B1 * | 12/2019 | Rahimian | H01M 10/0525 |
| 10,539,621 | B2 * | 1/2020 | Chow | G01R 31/367 |
| 11,637,331 | B2 * | 4/2023 | Chemali | G01R 31/392 702/63 |
| 11,656,290 | B2 * | 5/2023 | Nagai | H01M 10/0525 702/63 |
| 12,498,424 | B2 * | 12/2025 | Choi | G01R 31/389 |
| 2011/0060538 | A1 * | 3/2011 | Fahimi | G01R 31/392 702/63 |
| 2012/0098481 | A1 * | 4/2012 | Hunter | H02J 7/977 703/13 |
| 2014/0278167 | A1 * | 9/2014 | Frost | B60L 58/12 702/63 |
| 2014/0333317 | A1 * | 11/2014 | Frost | G01R 31/3842 324/430 |
| 2014/0350877 | A1 * | 11/2014 | Chow | G01R 31/3842 702/63 |
| 2016/0363629 | A1 * | 12/2016 | Frost | B60W 30/188 |
| 2017/0088002 | A1 * | 3/2017 | Deshpande | G01R 31/3835 |
| 2019/0079136 | A1 * | 3/2019 | Lim | G01R 31/3842 |
| 2020/0136173 | A1 * | 4/2020 | Hong | H02J 7/933 |
| 2020/0164763 | A1 * | 5/2020 | Holme | B60L 3/12 |
| 2021/0231745 | A1 * | 7/2021 | Nagai | G01R 31/392 |
| 2021/0278472 | A1 * | 9/2021 | Sakai | H01M 10/0562 |
| 2021/0336462 | A1 * | 10/2021 | Wang | G01R 31/367 |
| 2022/0091189 | A1 * | 3/2022 | Osamura | G01R 31/367 |
| 2023/0324469 | A1 * | 10/2023 | Choi | G01R 31/389 702/60 |
| 2025/0244732 | A1 * | 7/2025 | Casasnovas Gonzáles | G05B 17/02 |

OTHER PUBLICATIONS

Meddings et al., "Application of electrochemical impedance spectroscopy to commercial Li-ion cells: A review," Journal of Power Sources, vol. 480, p. 228742, 2020.

Miao et al., "Current Li-Ion Battery Technologies in Electric Vehicles and Opportunities for Advancements," Energies, vol. 12, p. 1074, 2019.

Muhtadi et al., "Distributed Energy Resources based Microgrid: Review of Architecture, Control, and Reliability," IEEE Transactions on Industry Applications, vol. 57, No. 3, pp. 2223-2234, 2021.

Nasser-Eddine et al., "Fast time domain identification of electrochemical systems at low frequencies using fractional modeling," Journal of Electroanalytical Chemistry, vol. 862, p. 113957, Apr. 2020.

Nguyen et al., "Determination of Diffusion Coefficients Using Impedance Spectroscopy Data," Journal of the Electrochemical Society, vol. 165, pp. E826-E831, 2018.

Ovejas et al., "State of charge dependency of the overvoltage generated in commercial Li-ion cells," Journal of Power Sources, vol. 418, pp. 176-185, 2019.

Pastor-Fernandez et al., "A Comparison between Electrochemical Impedance Spectroscopy and Incremental Capacity-Differential Voltage as Li-ion DiagnosticTechniques to Identify and Quantify the Effects of Degradation Modes within Battery Management Systems," Journal of Power Sources, vol. 360, pp. 301-318, 2017.

Pastor-Fernandez et al., "Critical review of non-invasive diagnosis techniques for quantification of degradation modes in lithium-ion batteries," Renewable and Sustainable Energy Reviews, vol. 109, pp. 138-159, 2019.

Plett, "Equivalent-Circuit Cell Models," ECE4710/5710: Modeling, Simulation, and Identification of Battery Dynamics, University of Colorado, 2016.

Preger et al., "Degradation of Commercial Lithium-ion Cells as a Function of Chemistry and Cycling Conditions," J. Electrochem. Soc., vol. 167, p. 120532, 2020.

Ramadass et al., "Development of First Principles Capacity Fade Model for Li-Ion Cells," Journal oif the Electrochemical Society, vol. 151, No. 2, pp. A196-A203, 2004.

Reniers et al., "Unlocking Extra Value from Grid Batteries Using Advanced Models," Journal of Power Sources, vol. 487, p. 229355, Mar. 2021.

Saidani et al., "Lithium-ion battery models: a comparative study and a model-based powerline communication," Advances in Radio Science, vol. 15, pp. 83-91, 2017.

Savitzky et al., "Smoothing and Differentiation of Data by Simplified Least Squares Procedures," Analytical Chemistry, vol. 36, No. 8, pp. 1627-1638, 1964.

Saw et al., "Electro-thermal analysis and integration issues of lithium ion battery for electric vehicles," Applied Energy, vol. 131, pp. 97-107, Oct. 2014.

Saxena et al., "Battery Stress Factor Ranking for Accelerated Degradation Test Planning Using Machine Learning," Energies, vol. 14, p. 723, 2021.

Severson et al., "Data-driven prediction of battery cycle life before capacity degradation," Nature Energy, vol. 4, No. 5, pp. 383-391, Mar. 2019.

Smiley et al., "An adaptive physics-based reduced-order model of an aged lithium-ion cell, selected using an interacting multiple-model Kalman filter," Journal of Energy Storage, vol. 19, pp. 120-134, Oct. 2018.

Tian et al., "Fractional order battery modelling methodologies for electric vehicle applications: Recent advances and perspectives," Science China Technological Services, vol. 63, No. 11, Aug. 2020.

Tian et al., "Fractional-Order Model-Based Incremental Capacity Analysis for Degradation State Recognition of Lithium-Ion Batteries," IEEE Transactions on Industrial Electronics, vol. 66, Issue 2, pp. 1576-1584, Jan. 2018.

Ugray et al., "Scatter Search and Local NLP Solvers: A Multistart Framework for Global Optimization," Informs Journal on Computing, vol. 19, No. 3, pp. 328-340, 2007.

Unknown, "Climate Change 2021: The physical science basis, contribution of working group I to the sixth assessment report of the intergovernmental panel on climate change," Cambridge University Press, 2021.

Unknown, "Cynlinderical Cells: INR18650-20R," Center for Advanced Life Cycle Engineering, University of Maryland, 2015.

Unknown, "Energy market and operational data," New York Independent System Operator, 2022.

Unknown, "Household Electrical Survey," Department of Energy and Climate Change UK, 2014.

Unknown, "National Solar Radiation Database," National Renewable Energy Laboratory, 2022.

Unknown, "Tesla Powerwall 2," Tesla datasheet, 2022.

Unknown, "Value of Distributed Energy Resources (VDER)," Joint Utilities of New York, 2021.

Unknown, "Value of Distributed Energy," Public Service Enterprise Group, 2022.

Waag et al., "Critical review of the methods for monitoring of lithium-ion batteries in electric and hybrid vehicles," Journal of Power Sources, vol. 258, pp. 321-339, Jul. 2014.

Wang et al., "A comprehensive review of battery modeling and state estimation approaches for advanced battery management systems," Renewable and Sustainable Energy Reviews, vol. 131, p. 110015, Oct. 2020.

Wang et al., "Review on modeling of the anode solid electrolyte interphase (SEI) for lithium-ion batteries," Computational Materials, vol. 4, No. 15, Mar. 2018.

Wei et al., "Future smart battery and management: Advanced sensing from external to embedded multi-dimensional measurement," Journal of Power Sources, vol. 489, p. 229462, Mar. 2021.

Weppner et al., "Determination of the Kinetic Parameters of Mixed-Conducting Electrodes and Application to the System Li3Sb," Journal of the Electromechanical Society, vol. 124, No. 10, p. 1569, 1977.

Westerhoff et al., "Analysis of Lithium-Ion Battery Models Based on Electrochemical Impedance Spectroscopy," Energy Technology, vol. 4, pp. 1620-1630, 2016.

(56) References Cited

OTHER PUBLICATIONS

Widanage et al., "Design and use of multisine signals for Li-ion battery equivalent circuit modelling. Part 1: Signal design," Journal of Power Sources, vol. 324, pp. 70-78, 2016.
Yamashita et al., "Two-level hierarchical model predictive control with an optimised cost function for energy management in building microgrids," Applied Energy, vol. 285, p. 116420, 2021.
Yu et al., "A Comparative Study on Open Circuit Voltage Models for Lithium-ion Batteries," Chinese Journal of Mechanical Engineering, vol. 31, p. 65, 2018.
Zappen et al., "Application of Time-Resolved Multi-Sine Impedance Spectroscopy for Lithium-Ion Battery Characterization," Batteries, vol. 4, No. 64, 2018.
Zhang et al., "A Study on the Open Circuit Voltage and State of Charge Characterization of High Capacity Lithium-Ion Battery Under Different Temperature," Energies, vol. 11, p. 2408, Sep. 2018.
Zhao et al., "Modeling the Effects of Thermal Gradients Induced by Tab and Surface Cooling on Lithium Ion Cell Performance," Journal of the Electrochemical Society, vol. 165, No. 13, pp. A3169-A3178, Oct. 2018.
Zia et al., "Microgrids energy management systems: A critical review on methods, solutions, and prospects," Applied Energy, vol. 222, pp. 1033-1055, Jul. 2018.
Zou et al., "Nonlinear Fractional-Order Estimator With Guaranteed Robustness and Stability for Lithium-Ion Batteries," IEEE Transactions on Industrial Electronics, vol. 65, Issue 7, pp. 5951-5961, Dec. 2017.
Al et al., "Electrochemical Thermal-Mechanical Modelling of Stress Inhomogeneity in Lithium-Ion Pouch Cells," Journal of the Electrochemical Society, vol. 167, p. 013512, 2020.
Akpolat et al., "Dynamic Stabilization of DC Microgrids using ANN-Based Model Predictive Control," IEEE Transactions on Energy Conversion, vol. 37, No. 2, pp. 999-1010, 2022.
Alavi et al., "Time-domain fitting of battery electrochemical impedance models," Journal of Power Sources, vol. 288, pp. 345-352, Aug. 2015.
Androulakis et al., "aBB: A Global Optimization Method for General Constrained Nonconvex Problems," Journal of Global Optimization, vol. 7, pp. 337-363, 1995.
Antoniadou-Plytaria et al., "Market-based Energy Management Model of a Building Microgrid Considering Battery Degradation," IEEE Trans. Smart Grid, vol. 12, No. 2, pp. 1794-1804, 2021.
Azuatlam et al., "Energy management of small-scale PV-battery systems: A systematic review considering practical implementation, computational requirements, quality of input data and battery degradation," Renewable and Sustainable Energy Reviews, vol. 112, pp. 555-570, Sep. 2019.
Barai et al., "A comparison of methodologies for the non-invasive characterisation of commercial Li-ion cells," Progress in Energy and Combustion Science, vol. 72, pp. 1-31, Jan. 2019.
Barbero et al., "Analysis of Warburg's impedance and of its equivalent electric circuits," Physical Chemistry Physical Physics, vol. 19, No. 36, Aug. 2017.
Belt, "Battery Test Manual for Plug-In Hybrid Electric Vehicles," Idaho National Lab, vol. 449, No. 227297, 2010.
Bernardi et al., "Analysis of pulse and relaxation behavior in lithium-ion batteries," Journal of Power Sources, vol. 196, Issue 1, pp. 412-427, Jan. 2011.
Bordin et al., "A Linear Programming Approach for Battery Degradation Analysis and Optimization in Offgrid Power Systems with Solar Energy Integration," Renewable Energy, vol. 101, pp. 417-430, 2017.
Brady et al., "Operando Study of LiV3O8 Cathode: Coupling EDXRD Measurements to Simulations," Journal of the Electrochemical Society, vol. 165, No. 2, pp. A371-A379, 2018.
Brivio et al., "A Physically-Based Electrical Model for Lithium-Ion Cells," IEEE Transactions on Energy Conversion, vol. 34, Issue 2, pp. 594-603, Jun. 2019.
Chen et al., "A novel approach to reconstruct open circuit voltage for state of charge estimation of lithium ion batteries in electric vehicles," Applied Energy, vol. 255, p. 113758, Dec. 2019.
Chen et al., "Overpotential analysis of graphite-based Li-ion batteries seen from a porous electrode modeling perspective," Journal of Power Sources, vol. 509, p. 23045, Aug. 2021.
Chen et al., "State of Charge Estimation for Lithium-ion Battery Using Long Short-Term Memory Networks," Journal of Physics, vol. 2890, 012024, 2024.
Choi et al., "Modeling and Applications of Electrochemical Impedance Spectroscopy (EIS) for Lithium-ion Batteries," J. Electrochem. Sci. Technol., vol. 11, No. 1, pp. 1-13, 2020.
Cole et al., "Dispersion and Absorption in Dielectrics I. Alternating Current Characteristics," The Journal of Chemical Physics, vol. 9, pp. 341-351, Apr. 1941.
Du et al., "An Information Appraisal Procedure: Endows Reliable Online Parameter Identification to Lithium-Ion Battery Model," IEEE Transactions on Industrial Electronics, vol. 69, Issue 6, pp. 5889-5899, Jun. 2021.
Edge et al., "Lithium ion battery degradation: what you need to know," Phys. Chem. Chem. Phys., vol. 23, p. 8200, 2021.
Ekstrom et al., "Comparison of lumped diffusion models for voltage prediction of a lithium-ion battery cell during dynamic loads," Journal of Power Sources, vol. 402, pp. 296-300, Oct. 2018.
Ernst et al., "Capturing the Current-Overpotential Nonlinearity of Lithium-Ion Batteries by Nonlinear Electrochemical Impedance Spectroscopy (NLEIS) in Charge and Discharge Direction," Frontiers in Energy Research, vol. 7, Article. 151, Dec. 2019.
Gantenbein et al., "Impedance based time-domain modeling of lithium-ion batteries: Part I," Journal of Power Sources, vol. 379, pp. 317-327, Mar. 2018.
Gao et al., "Co-Estimation of State-of-Charge and State-of-Health for Lithium-Ion Batteries Using an Enhanced Electrochemical Model," IEEE Transactions on Industrial Electronics, vol. 69, Issue 3, pp. 2684-2696, Mar. 2021.
Gao et al., "Modeling electrode-level crack and quantifying its effect on battery performance and impedance," Electrochimica Acta, vol. 363, p. 137197, Dec. 2020.
Guo et al., "Physics-based fractional-order model with simplified solid phase diffusion of lithium-ion battery," Journal of Energy Storage, vol. 30, p. 101404, Aug. 2020.
Guo et al., "State of health estimation for lithium ion batteries based on charging curves," Journal of Power Sources, vol. 249, pp. 457-462, 2014.
He et al., "Reduced-order thermal modeling of liquid-cooled lithium-ion battery pack for EVs and HEVs," IEEE Transportation Electrification Conference and Expo (ITEC), Jun. 2017.
Hirsch et al., "Microgrids: A review of technologies, key drivers, and outstanding issues," Renewable and Sustainable Energy Reviews, vol. 90, pp. 402-411, 2018.
Hu et al., "Model Predictive Control of Microgrids—An Overview," Renewable and Sustainable Energy Reviews, vol. 136, p. 110422, Feb. 2021.
Hui et al., "Determining the Length Scale of Transport Impedances in Li-Ion Electrodes: Li(Ni0.33Mn0.33Co0.33)O2," Journal of the Electrochemical Society, vol. 167, p. 100542, Jun. 2020.
Kabir et al., "Degradation mechanisms in Li-ion batteries: a state-of-the-art review," International Journal of Energy Research, vol. 41, pp. 196-198, 2017.
Kanamura et al., "Electrochemical Evaluation of Active Materials for Lithium Ion Batteries by One (Single) Particle Measurement," Electrochemistry, vol. 84, No. 10, pp. 759-765, 2016.
Kim et al., "A systematic review of the smart energy conservation system: From smart homes to sustainable smart cities," Renewable and Sustainable Energy Reviews, vol. 140, p. 110755, Apr. 2021.
Kim et al., "Lithium-ion batteries: outlook on present, future, and hybridized technologies," Journal of Materials Chemistry, Issue 7, pp. 2942-2964, 2019.
Kollmeyer, "Panasonic 18650PF Li-ion Battery Data," Mendeley Data, Jun. 2018.

(56) References Cited

OTHER PUBLICATIONS

Krewer et al., "Review-Dynamic Models of Li-Ion Batteries for Diagnosis and Operation: A Review and Perspective," Journal of the Electromechanical Society, vol. 165, No. 16, pp. A3656-A3673, Nov. 2018.
Lamp et al., "Large-scale Battery Storage, Short-term Market Outcomes, and Arbitrage," Energy Economics, vol. 107, No. 105786, 2022.
Li et al., "A Single Particle Model for Lithium-Ion Batteries with Electrolyte and Stress-Enhanced Diffusion Physics," Journal of the Electrochemical Society, vol. 164, No. 4, p. A874, Feb. 2017.
Li et al., "Aging modes analysis and physical parameter identification based on a simplified electrochemical model for lithium-ion batteries," Journal of Energy Storage, vol. 31, p. 101538, Oct. 2020.
Li et al., "Development of a Degradation-Conscious Physics-Based Lithium-Ion Battery Model for Use in Power System Planning Studies," Applied Energy, vol. 248, pp. 512-525, 2019.
Li et al., "Discrete-time modeling of Li-ion batteries with electrochemical overpotentials including diffusion," Journal of Power Sources, vol. 500, p. 229991, Jul. 2021.
Li et al., "Health and performance diagnostics in Li-ion batteries with pulse-injection-aided machine learning," Applied Energy, vol. 315, p. 119005, Jun. 2022.
Li et al., "Towards unified machine learning characterization of lithium-ion battery degradation across multiple levels: A critical review," Applied Energy, vol. 316, p. 119030, Jun. 2022.
Liebhart et al., "Passive impedance spectroscopy for monitoring lithium-ion battery cells during vehicle operation," Journal of Power Sources, vol. 449, p. 227297, Feb. 2020.
Lohman et al., "Electrochemical impedance spectroscopy for lithium-ion cells: Test equipment and procedures for aging and fast characterization in time and frequency domain," Journal of Power Sources, vol. 273, pp. 613-623, Jan. 2015.
Lu et al., "A review on the key issues for lithium-ion battery management in electric vehicles," Journal of Power Sources, vol. 226, pp. 272-288, 2013.
Ma et al., "A mechanism identification model based state-of-health diagnosis of lithium-ion batteries for energy storage applications," Journal of Cleaner Production, vol. 193, pp. 379-390, 2018.
Marquis et al., "A Suite of Reduced-Order Models of a Single-Layer Lithium-ion Pouch Cell," J. Electrochem. Soc., vol. 167, Aug. 2020.
Marquis et al., "An Asymptotic Derivation of a Single Particle Model with Electrolyte," Journal of the Electrochemical Society, vol. 166, p. A2693-A3706, Nov. 2019.

* cited by examiner

700
Cell current [A]
2.5
0.0
-2.5
Sawtooth
Steps
0
100
200
300
Time [s]
710
MAPE [%]
0.10
0.05
0.00
Horizon length [s]

720
740
Voltage [V]
3.5
3.4
CDD model
Percent error [%]
0.25
0.00
-0.25
Time [s]
730
750
50
100
150
200
250
300
Horizon length [s]

SYSTEMS AND METHODS FOR BATTERY PERFORMANCE MONITORING AND MANAGEMENT USING DISCRETE-TIME STATE-SPACE OVERPOTENTIAL BATTERY MODELS

CROSS-REFERENCE TO RELATED APPLICATIONS

This application claims the benefit of, and priority to, U.S. Provisional Application No. 63/412,956, entitled "SYSTEMS AND METHODS FOR BATTERY PERFORMANCE MANAGEMENT USING OVERPOTENTIAL BATTERY MODELS" and filed Oct. 4, 2022, the content of which is incorporated herein by reference in its entirety.

BACKGROUND

Lithium-ion battery (LIB) models form the basis of most battery management systems (BMS). The BMS depends on accurate models to perform state estimation. Battery models can also be used to provide insight into cell degradation, which could allow for advanced degradation-reduction techniques. There are two (2) popular model types: physics-based models (PBM) and equivalent circuit models (ECM). PBMs are highly accurate and offer insight into internal cell processes, but face challenges in real-time use. ECMs are especially popular in electric vehicle (EV) applications for their simplicity and speed. More recently, fractional-order models (FOM) and physically-meaningful ECMs have been proposed that can quantify electrochemical overpotentials in the cell. The frequency-varying impedance is modelled with a FOM such as the Randles circuit, whose parameters can be used to provide insight into degradation modes in the cell. FOMs include a constant-phase element (CPE). The CPE is defined by a fractional-order transfer function, which is shown to accurately capture the charge transfer and diffusion overpotentials. FOMs face challenges in BMS implementation because frequency-domain data is difficult to obtain in real-time.

SUMMARY

Described herein is a proposed battery performance management framework for lithium-ion batteries (LIB) model that characterizes the overpotentials generated by ion transport and the change in the open-circuit voltage in a cell. The proposed framework models the ohmic, charge transfer, and diffusion overpotentials, and uses the standard resistor-capacitor pair elements for the ohmic and charge transfer dynamics. Diffusion dynamics are derived from the convolution-defined diffusion (CDD) model. The proposed framework uses a discrete-time state-space approximation of the CDD model (using a "receding-horizon diffusion," or RHD, approach) model. To identify the parameters, battery voltage, current and an optimization process are used. Experimentation results show that battery voltage can be tracked with 99% accuracy. Furthermore, the overpotential information allows cell internal parameters to be monitored. This helps determine the maximum power output capabilities of the cell, which varies with the degradation level. The RHD model of the proposed framework may be integrated into battery management systems in, for example, electric vehicles, electrical grids (e.g., that include PV arrays), as well as other applications, and can be used in standard state estimation techniques.

Thus, in some variations, a method for monitoring and managing battery performance is provided that includes deriving a representation of diffusion overpotential behavior for a lithium-ion battery according to a discrete-time state-space approximation of a convolution-defined diffusion (CDD) model for the lithium-ion battery, and determining behavior of the lithium-ion battery according to the discrete-time state-space approximation of the convolution-defined diffusion (CDD) model for the lithium-ion battery.

Embodiments of the method may include at least some of the features described in the present disclosure, including one or more of the following features.

Determining the behavior of the lithium-ion battery may include applying input current to the lithium-ion battery, capturing voltage response of the lithium-ion battery resulting from applying the input current, and determining diffusion overpotential for the lithium-ion battery based on analysis of the voltage response according to the discrete-time state-space approximation of the convolution-defined diffusion (CDD) model.

Deriving the representation of the diffusion overpotential behavior may include deriving the discrete-time state-space approximation based on a recursive formulation using diffusion state data computed by the model extending back to a pre-determined number of instances defining a finite time horizon.

Deriving the representation of the diffusion overpotential behavior may include deriving a diffusion related constant, $A_D$, at steady state for the lithium-ion battery, with the lithium-ion battery comprising a nickel-manganese cobalt (NMC) cell, according to:

$$A_D = \frac{2\beta v_M}{SF\sqrt{D\pi}}$$

where $1/\beta$ is the maximum stoichiometric added lithium, $v_M$ is the molar volume of the NMC cell, S is the active surface area, F is Faraday's constant, and D is the Lithium-ion diffusion coefficient.

Deriving the representation of the diffusion overpotential behavior may include determining the CDD model representing the diffusion overpotential behavior of the lithium-ion battery as the product of a diffusion related constant $A_D$, and a convolution of a unit impulse response, $g_z(t)$, with a time-dependent diffusion state amplitude, $\xi$, for the lithium-ion battery according to:

$$V_D(t) = A_D \zeta(t) * g_z(t),$$

with the time-dependent diffusion state amplitude, $\xi$, being determined based on a step change $\Delta I$ and a gradient of the open-circuit voltage (OCV) curve for the lithium-ion battery, given by:

$$\zeta_n(t) = \Delta I(t_n) \nabla V_{OC} \sqrt{t - t_n},$$

and with $g_z(t)$ being defined as $g_z(t)=\sqrt{t}-\sqrt{t-\Delta t}$.

The method may further include deriving the discrete-time state-space approximation according to a recursive relationship represented as:

$$x_v(t_{k+1}) = A_v x_v(t_k) + B_v u_v(t_k)$$

$$V_D(t_k) = C_v x_v(t_k)$$

where $x_v(t_k)$ is a diffusion state vector comprising diffusion state samples, $u_v(t_k)$ is an input current vector applied to the lithium-ion battery, $C_v$ is a vector with values depending on a diffusion related constant $A_D$, $A_v$ is a matrix with values depending on a relative sampling time for state samples of the discrete-time state-space model, and $B_v$ is a row vector with an entry that depends on an OCV gradient and differential current applied to the discrete-time state-space model.

Deriving the discrete-time state-space approximation according to the recursive relationship may include computing the diffusion overpotential $V_D$ based on a current diffusion state sample and M preceding diffusion state samples, where M is a pre-determined tunable value defining a computational horizon.

Computing the diffusion overpotential $V_D$ may include weighing the diffusion states samples arranged in $x_v(t_k)$ with diminishing weights, specified by the matrix $A_v$, to decrease the contribution of earlier computed diffusion states.

The non-zero diminishing weights specified in the matrix $A_v$ may be computed according to $$a_m = \sqrt{1 + \frac{1}{m}},$$

where m=1, 2, . . . , M, where M represents the number of samples in a computational horizon for computing the diffusion overpotential $V_D$.

The method may further include deriving based on the discrete-time state-space approximation one or more battery performance metrics and/or battery degradation data.

The method may further include determining based on the battery degradation data one or more of, for example, state of health (SoH) of the lithium-ion battery, and/or state of charge (SoC) for the lithium-ion battery.

In some variations, a battery performance monitoring and management system is provided that includes one or more memory storage devices to store data and executable instructions, and a processor-based controller, coupled to the one or more memory storage devices. The processor-based controller is configured to derive a representation of diffusion overpotential behavior for a lithium-ion battery according to a discrete-time state-space approximation of a convolution-defined diffusion (CDD) model for the lithium-ion battery, and determine behavior of the lithium-ion battery according to the discrete-time state-space approximation of the convolution-defined diffusion (CDD) model for the lithium-ion battery.

In some variations, a non-transitory computer readable media is provided that includes computer instructions executable on a processor-based device to derive a representation of diffusion overpotential behavior for a lithium-ion battery according to a discrete-time state-space approximation of a convolution-defined diffusion (CDD) model for the lithium-ion battery, and determine behavior of the lithium-ion battery according to the discrete-time state-space approximation of the convolution-defined diffusion (CDD) model for the lithium-ion battery.

Embodiments of the system and the computer readable media may include at least some of the features described in the present disclosure, including at least some of the features described above in relation to the method.

Other features and advantages of the invention are apparent from the following description, and from the claims.

BRIEF DESCRIPTION OF THE DRAWINGS

These and other aspects will now be described in detail with reference to the following drawings.

Like reference symbols in the various drawings indicate like elements.

DESCRIPTION

Described herein is a proposed battery performance management framework for lithium-ion batteries (LIB) that uses a novel equivalent circuit models referred to as the 'convolution-defined diffusion' (or CDD) and 'receding-horizon diffusion' (or RHD). The CDD model accurately describes the diffusion overpotential using convolution, while the RHD model presents a recursive matrix formulation that approximates the CDD. It is believed that this is the first time that a discrete-recursive state-space definition of diffusion is achieved with only one modelling parameter, and without fractional-order computations. The RHD model is accurate, fast, and linked to the diffusion coefficient. A standard BMS can easily implement the RHD model to track electrochemical overpotentials in real-time. Verification of the proposed approach using simulated and experimental data shows that the RHD model is fast, accurate, and general-purpose compared to standard RC-pair circuits. It can be easily adapted to existing BMS state estimation techniques such as Kalman filters and can offer further insight into battery degradation. In some embodiments, more extreme temperatures and current rates can be integrated into the modeling framework. In various examples, subsampling techniques could be used to reduce the size of the diffusion state vector. Finally, the RHD model can be integrated with advanced diagnostics in a real EV or grid system. This can give a greater understanding of internal cell dynamics with small increases in computation time.

Figure 1:
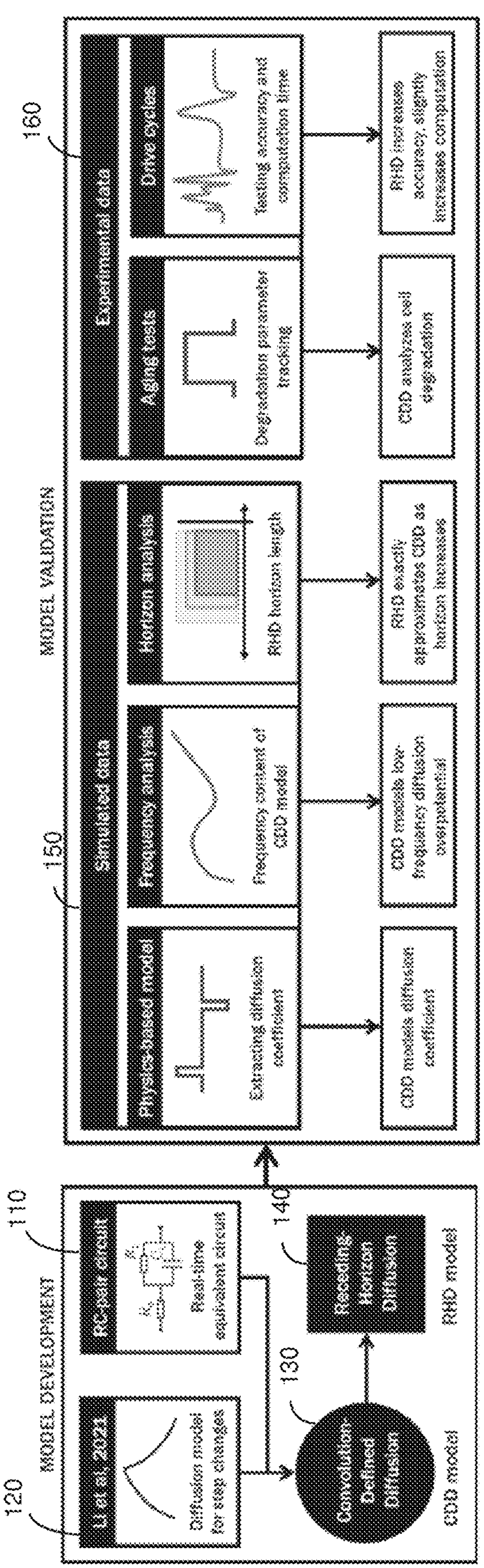
FIG. 1 is a diagram showing development of a convolution-defined diffusion (CDD) and a receding-horizon diffusion (RHD) model to approximate the CDD model.

With reference to FIG. 1, a diagram 100 showing development of the CDD and RHD models, and depicting the validation methodology for the proposed framework using simulated and experimental data, is shown. The proposed framework uses two novel definitions of diffusion overpotential. As can be seen, the CDD model combines the NRC real-time equivalent model 110 with a diffusion model 120 for step changes. The NRC model is a basic equivalent circuit model comprising one series resistor and N pairs of resistors and capacitors in parallel (known as RC pairs), where typically N>2, that is used to predict battery voltage, but yields limited information on degradation-related internal processes. The resultant CDD model 130 provides an ECM that includes the resistive and capacitive components of the NRC model, together with a diffusion overpotential component, and can provide physical interpretability and more extensive degradation information relating to the internal electrochemical processes occurring in the cell. As will be discussed in greater detail below, based on the determined CDD model, a discrete-time state-space approximation of the convolution-defined diffusion (CDD) model for the lithium-ion battery is derived. An example of such a discrete-time state-space approximation is a receding horizon diffusion (RHD) model (depicted in FIG. 1 as block 140), that uses a finite number of preceding diffusion state samples to determine diffusion overpotential data (based on which battery performance metrics and states can be determined).

Figure 2:
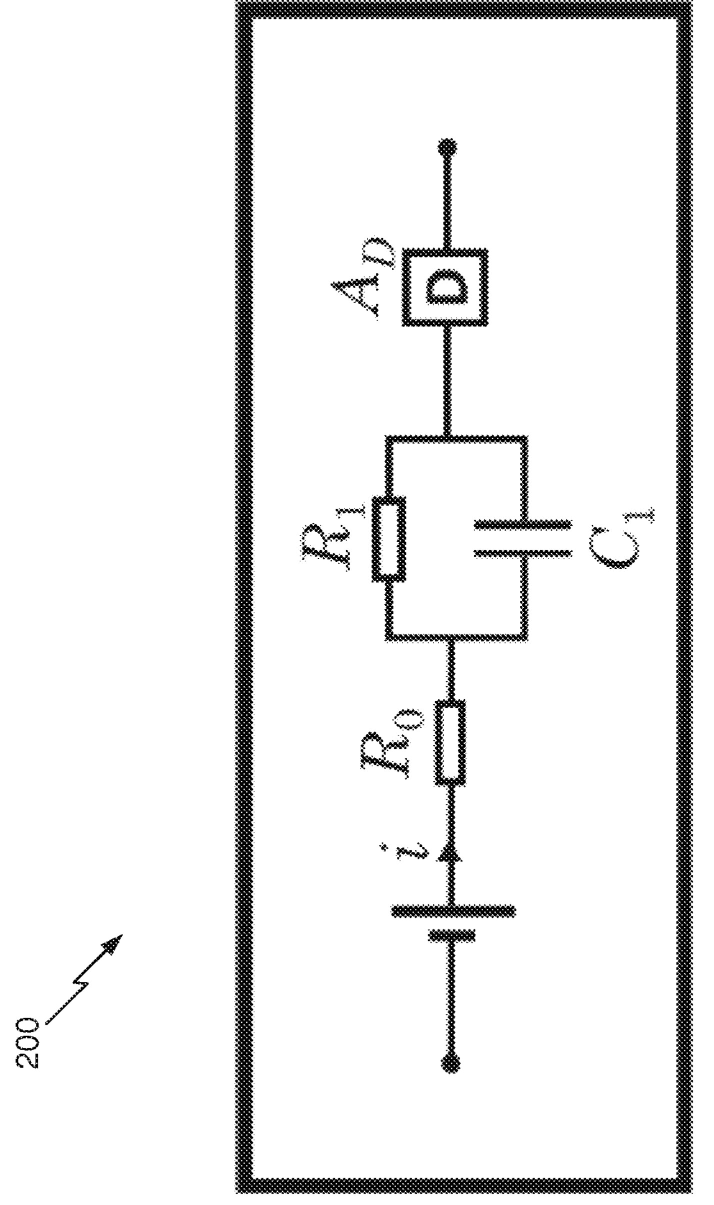
FIG. 2 is a circuit diagram for a CDD model.

The CDD model is represented by a circuit model 200 shown in FIG. 2, which characterizes ohmic, charge transfer, and diffusion overpotentials in the time-domain with four (4) impedance parameters: $R_0$, $R_1$, $C_1$, and $A_D$. The CDD model accurately describes the diffusion overpotential using convolution, but, disadvantageously, the CDD model generally requires the entire current history of a cell to be stored. This disadvantage is avoided by applying a receding-horizon. That is, all states beyond the horizon are assumed to saturate at some constant value. Only states within the horizon are tracked, and an offset term is used to store the saturated states. For real-time implementations, the RHD model is formulated with a linear discrete-time recursive state-space system. The RHD model provides a linear representation of diffusion using a single modelling parameter (e.g., the diffusion constant $A_D$) without fractional-order computations. Verification using simulated and experimental data shows that the RHD model is fast, accurate, and general-purpose compared to standard RC-pair circuits. It can be easily adapted into existing BMS state estimation techniques such as Kalman filters to offer further insight into battery degradation.

Details about the CDD and the RHD approximation will next be discussed. Under the CDD model, lithium-ion diffusion is quantified with the diffusion constant $A_D$, given by:

$$A_D = \frac{2\beta v_M}{SF\sqrt{D\pi}} \tag{1}$$

where $1/\beta$ is the maximum stoichiometric added lithium, $v_M$ is the molar volume of NMC, S is the active surface area, F is Faraday's constant, and D is the Lithium-ion diffusion coefficient.

It has been shown that in a DNRC model (a battery equivalent circuit model that includes a diffusion component and N resistor-capacitor pairs) each current step change at time to $t_n \le t$ incites a diffusion state $\psi_n(t)$ defined as:

$$\psi_n(t) = \zeta_n\sqrt{t - t_n} \tag{2}$$

with a diffusion state amplitude $\xi_n$ at step index n. The amplitude $\xi_n$ depends on the value of the step change $\Delta I$ and the gradient of the open-circuit voltage (OCV) curve, and is given by:

$$\zeta_n(t) = \Delta I(t_n)\nabla V_{OC}\sqrt{t - t_n} \tag{3}$$

where, $$\Delta I(t_n) = i(t_n) - i(t_n - \Delta t), \tag{4}$$

$$\nabla V_{OC}(t_n) = \frac{\partial V_{OC}}{\partial SoC}\Big|_{SoC(t_n)}$$

where $V_{OC}$ is the OCV, SoC is the state of charge, $\Delta t$ is the sampling interval, and i is the cell current.

The DNRC diffusion overpotential is then given by:

$$V_{DNRC}(t) = A_D\sum_{n=1}^{N_{step}}\psi_n(t) \tag{5}$$

where $N_{step}$ is the total number of step changes. It is undesirable to use a sum of accumulated states. Since the DNRC model requires each current step change to be identified and labelled, for an arbitrarily-varying cell current this formulation can be computationally prohibitive, hence the need for CDD.

To arrive at the CDD model, the input current is treated as a continuous-time system sampled with zero-order hold (ZOH). The ZOH-modified cell current is given by the sum of rectangle pulses, denoted as the function rect(·), $$i(t) = \sum_{k-0}^{\infty} i(t_k)\cdot rect\left(\frac{t - t_k - \frac{\Delta t}{2}}{\Delta t}\right) \tag{6}$$

for t>0. At each sampling index k, there are now two step changes in current corresponding to the rising and falling edge of the ZOH pulse. Thus, the diffusion overpotential becomes:

$$V_D(t) = A_D\sum_{k=0}^{\infty}(\psi_k(t) + \psi'_k(t)) \tag{7}$$

where $\psi_k(t)$ and $\psi'_k(t)$ are the rising and falling edge diffusion states due to the ZOH pulse at index k. Similarly, the diffusion state amplitude at the rising edge is given by, $$\zeta_k = i(t_k)\nabla V_{OC}(t_k) = \zeta(t_k) \tag{8}$$

which is equal and opposite at the falling edge, $\xi_k = -\xi_k$.

Note that $\xi$ can now be described as a function of time.

Substituting Equation (8) into Equation (2) yields the sum of the rising and falling edge states, as follows:

$$\psi_k(t)+\psi'_k(t)=\zeta(t_k)g_z(t-t_k) \tag{9}$$

for $t>t_k$, where the unit impulse response is defined as:

$$g_z(t)=\sqrt{t}-\sqrt{t-\Delta t} \tag{10}$$

The aggregated diffusion overpotential is therefore the infinite sum of the ZOH-modified responses, which represents convolution, denoted by *. Substituting Equation (9) into Equation (7) yields the CDD overpotential:

$$V_D(t)=A_D\sum_{k=0}^{\infty}\zeta(t_k)g_z(t-t_k)=A_D\cdot\zeta(t)*g_z(t) \tag{11}$$

Equation (11) shows that the diffusion overpotential can be represented as the convolution of the diffusion state amplitude ξ with the unit impulse response $g_z$. Compared to the DNRC formulation, convolution is computed much faster given an arbitrary current input. Convolution is not suitable for real-time, however, because the entire current history must be stored. A recursive definition is thus preferred. The CDD model is linked to FOMs due to its fractional-order impulse response. The Laplace transform G(s) of the continuous-time impulse response is given by:

$$G(s)=L\left(\lim_{\Delta t\to 0}\frac{g_z(t)}{\Delta t}\right)=L\left(\frac{1}{2\sqrt{t}}\right)=\sqrt{\frac{\pi}{4}}\,s^{-1/2} \tag{12}$$

which represents a semi-integral in the time-domain, expressible using fractional calculus.

The RHD model state equations are given by:

$$x(t_{k+1})=Ax(t_k)+Bu(t_k) \tag{13}$$
$$y(t_k)=Cx(t_k)+D_\ell u(t_k)$$

with $$x(t_k)=\begin{pmatrix}x_\ell(t_k)\\ x_v(t_k)\end{pmatrix},\ u(t_k)=\begin{pmatrix}i(t_k)\\ i(t_{k-1})\end{pmatrix} \tag{14}$$

and $$A=\begin{pmatrix}A_\ell & 0\\ 0 & A_v\end{pmatrix},\ B=\begin{pmatrix}B_\ell\\ B_v\end{pmatrix},\ C=(C_\ell\ C_v) \tag{15}$$

where the output is the sum of all overpotentials:

$$y(t_k)=V_s(t_k)+V_{ct}(t_k)+V_D(t_k) \tag{16}$$

The cell terminal voltage $V_o$ is then given by:

$$V_0(t_k)=V_{OC}(t_k)-y(t_k) \tag{17}$$

When N=2 RC-pairs are used, the variables $A_l$, $B_l$, $C_l$, and $D_l$ are given by standard NRC equations, namely:

$$A_\ell=\begin{pmatrix}e^{-\frac{\Delta t}{R_1C_1}} & \\ & e^{-\frac{\Delta t}{R_2C_2}}\end{pmatrix}, \tag{18}$$
$$B_\ell=\begin{pmatrix}1-e^{-\frac{\Delta t}{R_1C_1}} & 0\\ 1-e^{-\frac{\Delta t}{R_2C_2}} & 0\end{pmatrix},$$
$$C_\ell=(R_1\ R_2),\ C_\ell=(R_0\ 0)$$

It is to be noted that $x_l\in R^N$ is the solution and charge transfer state vector, $A_l\in R^{N\times N}$ is a diagonal matrix, $B_l\in R^N$ is a column vector, and $C_l\in R^N$ and $D_l\in R^N$ are row vectors. The variables $x_v$, $A_v$, $B_v$, and $C_v$ describe the diffusion element in the RHD model and are formulated below. As noted earlier, the DNRC model is infeasible for long time scales due to the constantly-growing state vector. Meanwhile, the CDD model requires the entire current history to be stored. These disadvantages are avoided by applying a receding-horizon. All states beyond the horizon are assumed to saturate at some constant value. Only states within the horizon are tracked, and an offset term is used to store the saturated states.

The recursive-discrete form of a diffusion state is obtained from ZOH discretization of Equation (2). Due to the non-linearity of square-root dynamics, it can be shown that the discrete-recursive definition is a piece-wise function of the form:

$$\psi_n(t_{k+1})=\begin{cases}\psi_n(t_k)\sqrt{1+\frac{1}{k-n}} & k>n\\ \zeta_n\sqrt{\Delta t} & k=n\\ 0 & k<n\end{cases} \tag{19}$$

For a continuously-varying current input, there is a current step at each k, so there is no longer a need to track the $n^{th}$ current step. Thus, from Equations (3) and (14), the following relationship is defined:

$$\psi_k(t_{k+1})=b_v(t_k)u(t_k) \tag{20}$$

where $b_v(t_k)\in R^2$ is a row vector dependent on the time step that introduces the OCV gradient and differential current into the RHD model:

$$b_v(t_k)=\nabla V_{OC}(t_k)\sqrt{\Delta t} \tag{21}$$

For a horizon with a length of M time steps, the diffusion overpotential becomes:

$$x_v(t_{k+1})=A_vx_v(t_k)+B_vu_v(t_k) \tag{22}$$
$$V_D(t_k)=C_vx_v(t_k)$$

where,

-continued $$x_v(t_k) = \begin{pmatrix} D_v(t_k) \\ x_{v,M}(t_k) \\ x_{v,M-1}(t_k) \\ \vdots \\ x_{v,1}(t_k) \\ x_{v,0}(t_k) \end{pmatrix} \tag{23}$$

$$A_v = \begin{pmatrix} 1 & a_M 0 & 0 & 0 & 0 & \ldots & 0 \\ 0 & 0 & a_M & 0 & 0 & \ldots & 0 \\ 0 & 0 & 0 & a_{M-1} & & & 0 \\ 0 & 0 & 0 & 0 & \ddots & & \vdots \\ \vdots & \vdots & \vdots & \vdots & & a_2 & 0 \\ 0 & 0 & 0 & 0 & \ldots & 0 & a_1 \\ 0 & 0 & 0 & 0 & \ldots & 0 & 0 \end{pmatrix} \tag{24}$$

$$B_v = \begin{pmatrix} 0 \\ \vdots \\ 0 \\ b_v(t_k) \end{pmatrix},$$

$$C_v = A_D(1 \ \ldots \ 1 \ \ 1)$$

where $x_v \in R^{M+2}$ is a column vector, $A_v \in R^{(M+2)\times(M+2)}$ is a square matrix, $B_v(k) \in R^{(M+2)\times 2}$ is a tall matrix with M+2 rows and 2 columns, $Cv \in R^{M+2}$ is a row vector, $D_v$ is a scalar, and $a_m$ is a scalar that is defined by the relative sampling time m, based on the relationship:

$$a_m = \sqrt{1 + \frac{1}{m}} \tag{25}$$

The parameter $A_D$ in $C_v$ is the only modelling parameter that must be identified. The step horizon M is treated as a tuning parameter that is fixed before implementation of the RHD model. Step horizon corresponds to a length of time, so for a 10 s horizon and a sampling interval of 0.1 s, M=100.

Dynamic processes occur in the state vector due to the off-diagonal of the matrix $A_v$. At each k, $A_v$ advances the states to the next time step. One state saturates and another is initialized. Saturated states are stored in the offset term $D_v$. This offset term is an accumulated sum of the saturated values linked to OCV change. In contrast to the CDD model, the RHD model only requires a fixed number of states that are updated recursively in discrete-time. Thus, a completely linear state-space definition is achieved.

Figure 3:
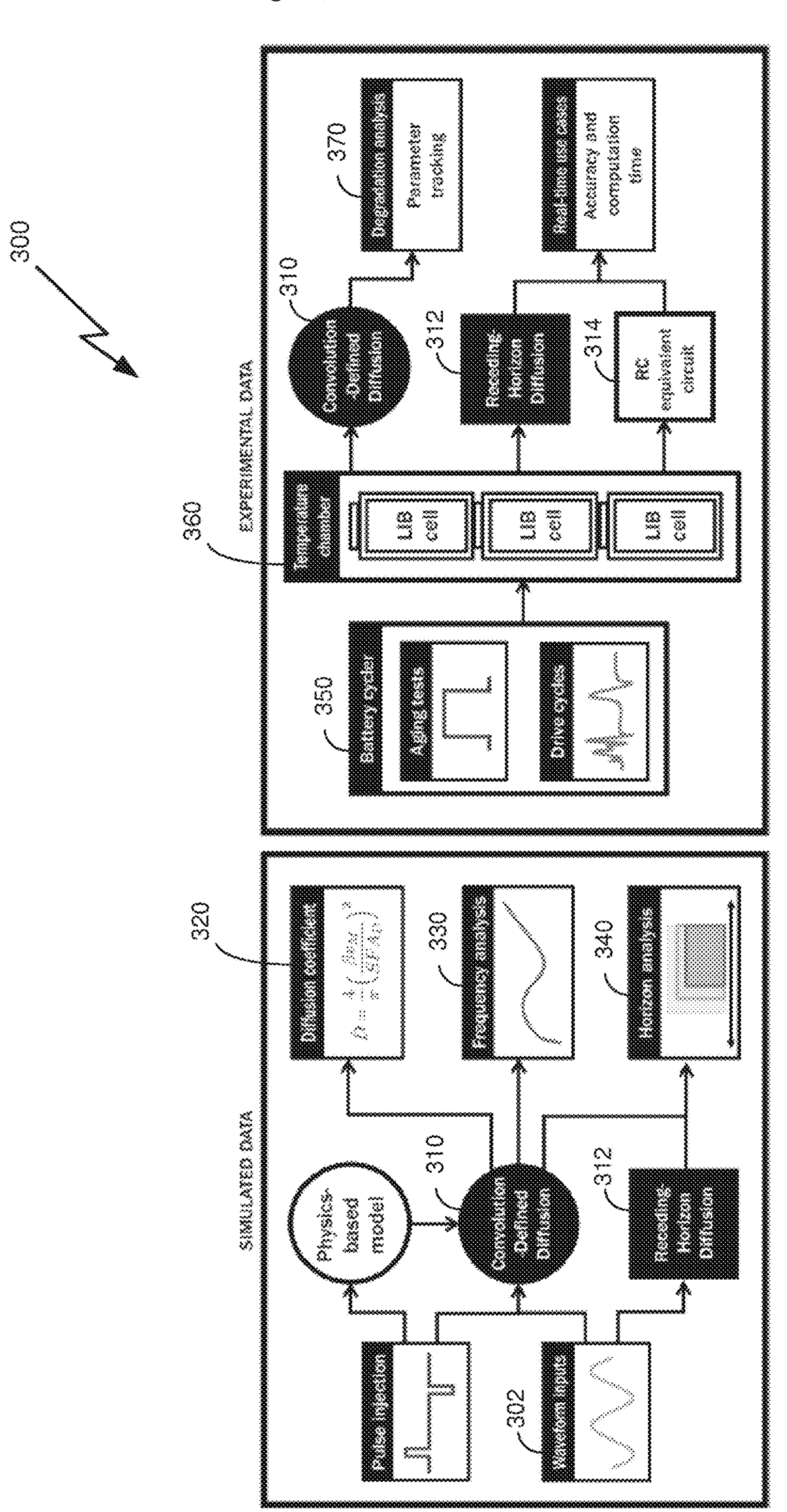
FIG. 3 is a diagram providing an overview of the simulated and experimental methodology described herein for the CDD and RHD models.

To verify that battery degradation data derived using an RHD-based model provide a good approximation to the CDD model, a fivefold verification process was performed. FIG. 3 is a diagram 300 providing an overview of the five-stage simulation and experimental methodology for the CDD and RHD models. In the first stage of the verification process, a CDD model module 310 is linked to diffusion by recovering, using a diffusion coefficient analysis module 320, the diffusion coefficient ($A_D$) using PBM-simulated data.

More particularly, in some embodiments, simulations of pulse perturbation are performed using varied diffusion coefficients in a coupled agglomerate-scale and electrode-scale continuum PBM for an NMC (nickel-manganese cobalt) cell. Diffusivities are in the range {0.2, 0.3, . . . , 1}$\times 10^{-10}$ while the nominal SoC ranges from 0.1 to 0.9. A CDD model module is then used to predict the diffusion coefficient. For simplicity, the PBM does not capture charge transfer dynamics, so no RC pairs are used in the CDD model (hence the name 'CDD-0RC'). The only modelling parameters are therefore $R_0$ and $A_D$. Apparent diffusivity $\hat{D}$ is calculated from the CDD parameter $A_D$ and the PBM parameters, according to:

$$\hat{D} = \frac{4}{\pi}\left(\frac{\beta v_M}{SFA_D}\right)^2 \tag{26}$$

where the parameters $1/\beta$=0.55 (corresponding to the maximum stoichiometric added lithium, $\varepsilon_{AM}$=0.306 (corresponding to the volume fraction of active material), $L_{agg}$=1 μm (corresponding to the agglomerate size), S is the active surface area, F is Faraday's constant, and D is the Lithium-ion diffusion coefficient.

In the second stage of the verification process, frequency analysis of the CDD-simulated data is performed at frequency analysis module 330. Frequency analysis of simulated CDD model data is performed by calculating the complex frequency-varying impedance Z(s) according to $$Z(s) = \frac{V(s)}{I(s)},$$

where s is the complex angular frequency, and V(s) and I(s) are the complex frequency spectra of the voltage and current. To obtain V(s) and I(s), the following example three operations may be performed:

1. Simulate time domain pulse voltage responses, with CDD-1RC model, lasting several minutes and with a sampling frequency 10 Hz. Pulses are used because they excite a wide range of frequencies.
2. Apply Hamming window to reduce spectral noise.
3. Perform discrete fast Fourier transform of the Hamming-windowed voltage and current data.

The Nyquist curve is a plot of the negative imaginary impedance −Im(Z) against real impedance Re(Z). A range of parameters are used, with $R_0$={0.02, 0.04, 0.08}Ω, $R_1$={0.01, 0.02, 0.03}Ω, $C_1$=1000 F, and $A_D$={9, 15, 25}$\times 10^{-4}$ $A^{-1}$ 1 $s^{-0.5}$. To observe the effects of $R_0$, $R_1$, and $A_D$, one parameter is varied while the others are held constant. This allows the frequency behavior to be clearly observed. Performance of the second stage of the verification process demonstrates strong links to diffusion.

In the third stage, the CDD model yields strong parameter variation trends in experimental degradation data. In an example, experimental cell aging data is collected from three (3) commercial 2.7 Ah lithium NMC oxide cells (Panasonic NCR18650PF) held, for example, at 10° C. (e.g., in a temperature chamber 360). A battery cycler 350 implements some pre-specified battery cycling protocol. For example, the battery cycler 350 is configured to cause cells to be degraded by low-voltage cycling at 1 C-rate, which can represent incomplete charging and high depth-of-discharge. This usage profile could be common in portable electronics. There are 14 unique SoH in the range [0.78, 1]. At each SoH, unipolar charge pulses are applied to the cell at nine (9) SoC in the range [0.1, 0.9]. A degradation analysis module 370 records and processes the experimental data captured from the behavior of the batteries in response to stimuli applied to them (e.g., via the battery cycler 350).

The CDD-1RC model parameters are then estimated from the voltage responses. Parameter estimation may be performed (at a parameter estimator module, which, in some embodiments, may be implemented at the degradation analysis module 370), for example, based on a scatter-search non-linear global optimization process. This is represented as: minimize f(θ) subject to θ>0. Next, the following relationships are defined:

$$f(\theta) = \|r\|_2^2 + w\|r'\|_2^2 \quad (27)$$

$$r = y - \hat{y}(\theta)$$

where f is the objective function, y and ŷ are the observed and predicted data vectors, θ is the parameter vector, $$\|r\|_2^2$$

is the sum of squared residuals, $$\|r'\|_2^2$$

is the sum of squared residual differences, and the weighting coefficient w is set to w=1.

In the fourth stage, performed by a horizon analysis module 340, RHD simulation is made to approximate the CDD model for a sufficient horizon length. For example, in some embodiments, voltage response data is simulated using an RHD model 312 and the CDD model 310 using rectangle and sawtooth wave input waveforms (e.g., generated by a waveform input generator 302). Identical parameters are used in the 2RC-pair models, but the RHD horizon length is varied from 10 s to 300 s, with example values of $R_0$=0.02Ω, $R_1$=0.1Ω, $R_2$=0.01Ω, $C_1$=7×10$^3$ F, $C_2$=1Ω10$^3$ F, and $A_D$=0.001 $A^{-1}s^{-0.5}$. The horizon-length-varying error between the RHD approximation and CDD simulation is then examined for both waveforms.

Finally, in the fifth stage, the RHD model 312 is shown to increase prediction accuracy using experimental drive-cycle data compared to NRC models (represented by block 314) and to track individual overpotentials.

Figure 4:
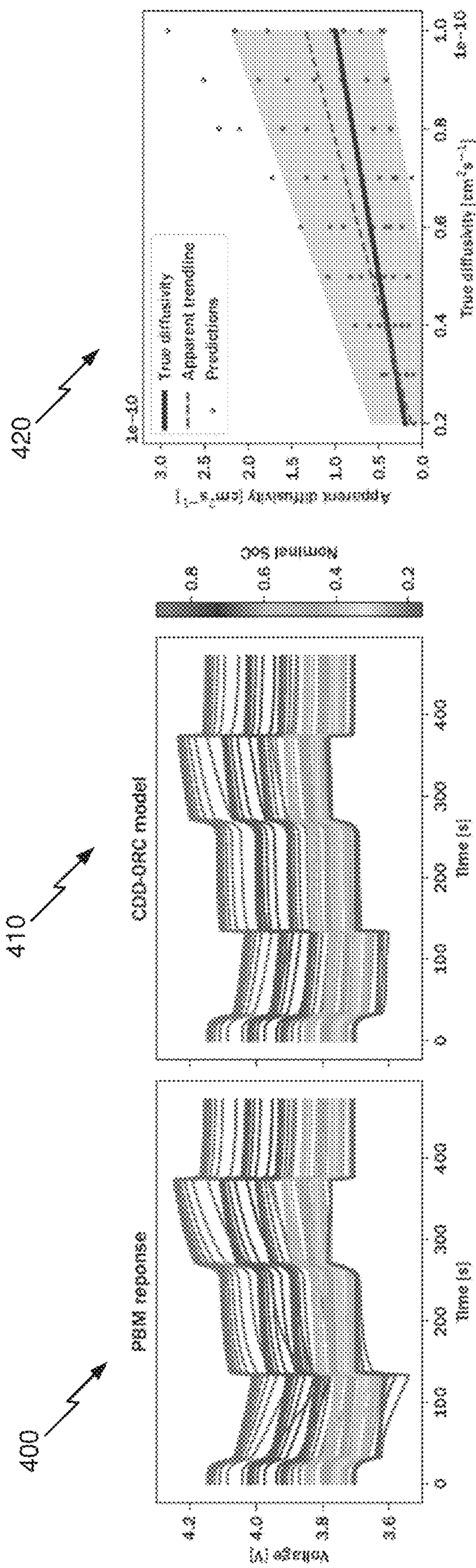
FIG. 4 includes graphs to compare the results obtained with a CDD-0RC model and a physics-based model.

To further verify the validity of the CDD model, the link between CDD and diffusion is demonstrated with PBM-simulated data. The aggregated diffusion coefficient of the cell can be determined from a physics-based model (PBM). The CDD-predicted apparent diffusivity $\hat{D}$ may be calculated from the diffusion constant $A_D$ and the known PBM parameters. This is then compared with the true model diffusivity D. FIG. 4 includes graphs to compare the results obtained with a CDD-0RC model and a PBM model. Graph 400 shows the PBM-simulated voltage response, while graph 410 shows the predicted CDD-0RC voltage response. Graph 420 shows the apparent diffusivity predicted by the CDD-0RC model compared with the true PBM diffusivity.

As illustrated in FIG. 4, the mean absolute percent error (MAPE) of the predicted voltage is bounded by 1% for all pulses. The highest error results from low diffusivities and high SoC which may cause OCV non-linearities not captured by the CDD model. Besides these extremes, the CDD model accurately models the PBM voltage response. The apparent diffusivity trendline demonstrates strong agreement with the true diffusivity. Variation in the individual estimates of apparent diffusivity is due to SoC-varying initial states, such as the initial concentration of lithium-ions. Despite SoC variation, the CDD model diffusion constant $A_D$ is shown to be directly linked to the internal diffusivity, verifying the CDD model hypothesis.

Figures 5A, 5B:
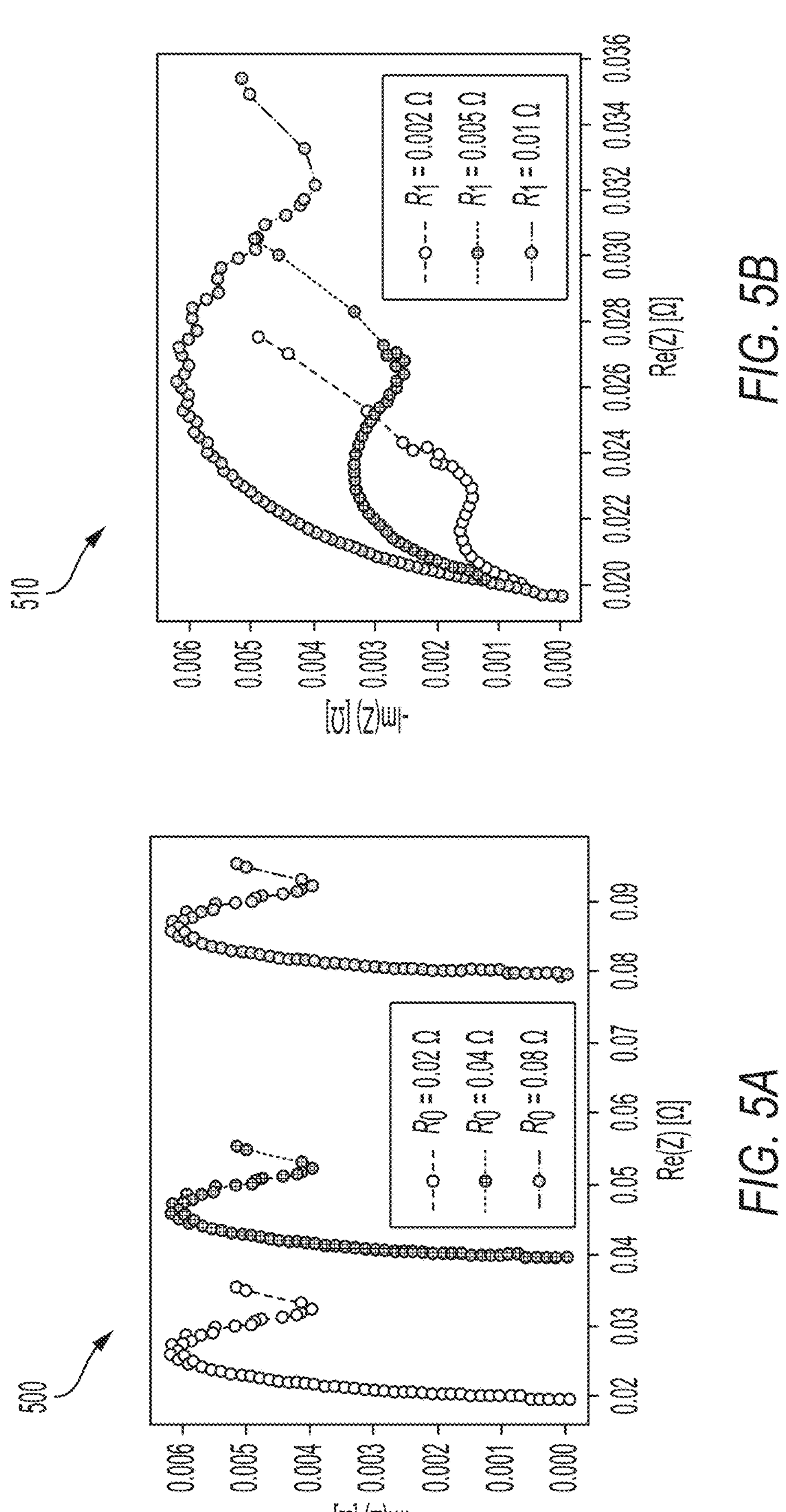
FIGS. 5A-5C include graphs of Nyquist curves generated from frequency analysis of simulated CDD-1RC time-domain data.
Figure 5C:
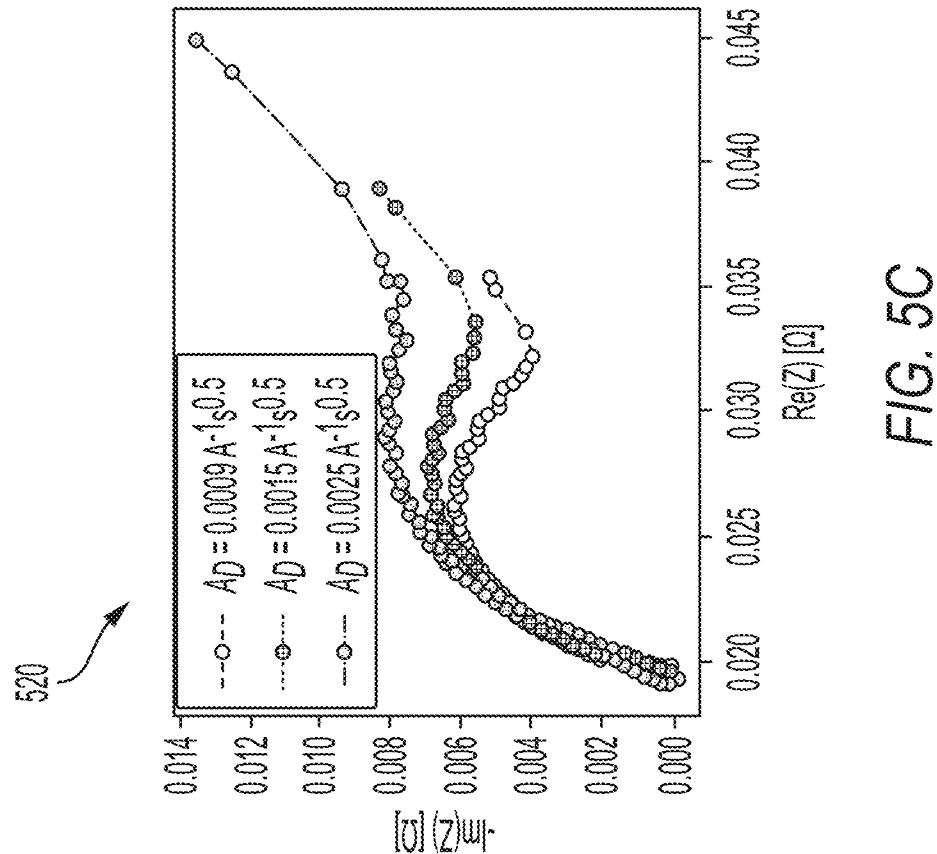
Figure 6A:
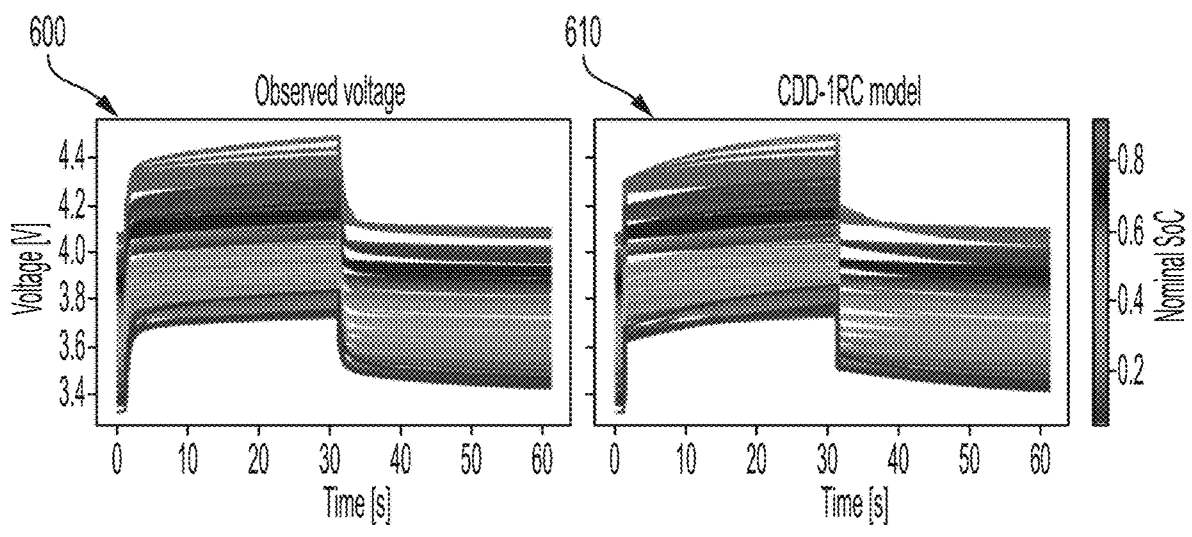
FIGS. 6A-6D include graphs presenting results for cells degraded at low temperature and SoC.
Figure 6B:
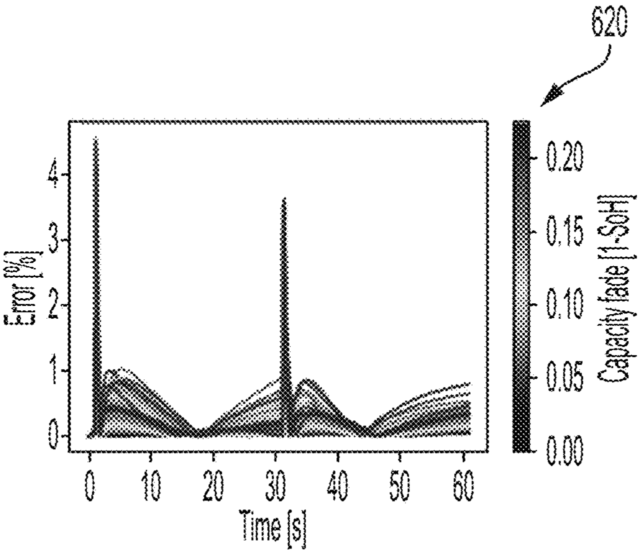
Figures 6C, 6D:
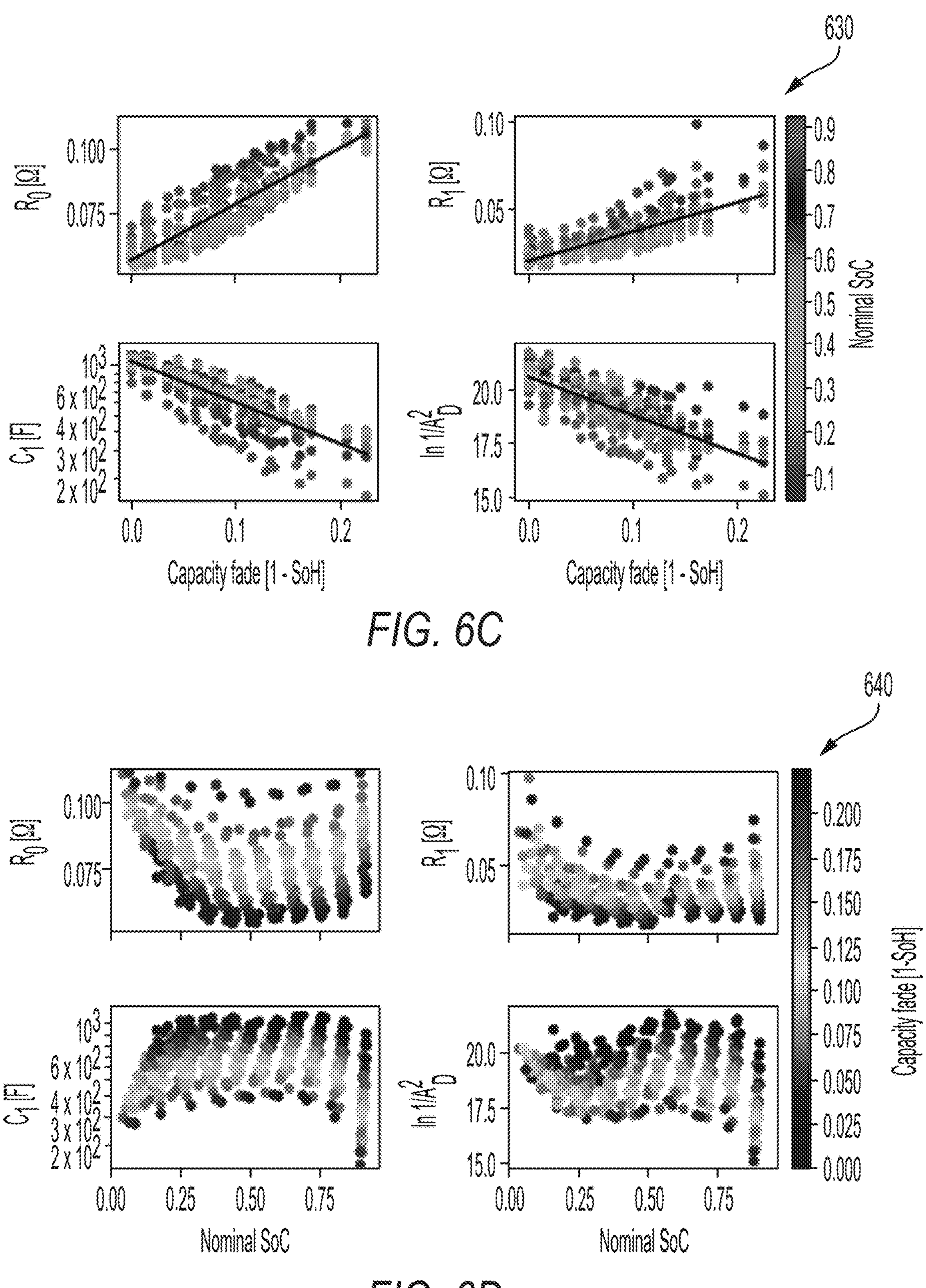

The second link to the diffusion overpotential is from frequency analysis of CDD-simulated data. In electrochemical impedance spectroscopy, the overpotentials are clearly observed in the frequency domain Nyquist curves. Only diffusion is known to affect the low-frequency 'tail'. Therefore, the frequency spectrum of the simulated CDD model should yield distinct behavior in the Nyquist curves. FIGS. 5A-5C include graphs of Nyquist curves generated from frequency analysis of simulated CDD-1RC time-domain data. Graphs 500-520 illustrate overpotential variations in solution (as shown in graph 500), in charge transfer (as shown in graph 510), and in diffusion (as shown in graph 520). From the graph results shown in FIGS. 5A-5C, it can be seen that the parameters affect the Nyquist plot as expected. Ohmic resistance $R_0$ shifts the x-axis crossing, $R_1$ affects the size of the mid-frequency semi-circle, and $A_D$ affects the low-frequency tail, again suggesting that $A_D$ is uniquely linked to diffusion.

Experimental aging data can be used to demonstrate how the CDD model can track cell parameters over the cell's lifetime. This is important for cell diagnostics. Different usage profiles may result in different parameter trends, which can inform optimal cell cycling conditions. Results for cells degraded at low temperature and SoC are shown in FIGS. 6A-6D. Specifically, graphs 600 and 610 show results for the observed cell voltage and the predicted CDD-1RC voltage. The MAPE of the predicted diagnostics pulse voltage is below 0.5% for all pulses, as can be seen from graph 620. The percent error illustrated in the graph 620 spikes at transitions, but otherwise remains low.

The graphs 630 and 640 show CDD-1RC modelling parameters plotted against SoH and SoC. There are very strong trends in the CDD-1RC parameters, as shown in the graphs 630 and 640. Resistances increase as state of health (SoH) decreases, while capacitance decreases. The diffusion constant $A_D$, which varies inversely with diffusivity, is seen to increase as SoH decreases.

Figures 7A, 7B:
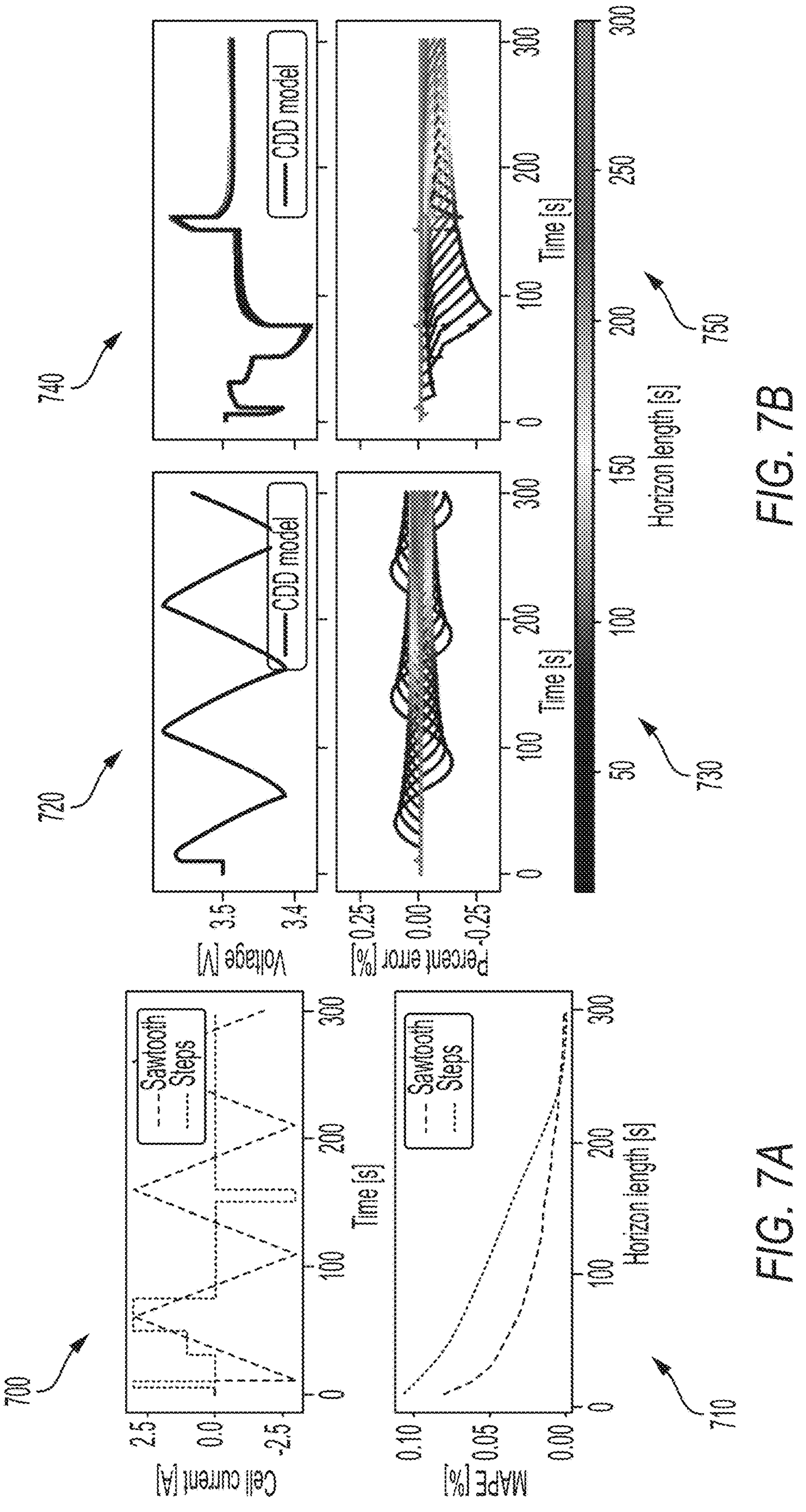
FIGS. 7A-7B include graphs showing simulation results computed for the CDD and RHD models.

To further verify the RHD model, simulations of the RHD and CDD models are compared to demonstrate how the receding horizon approximates convolution. Two waveforms were used for comparison: sawtooth and current steps. FIGS. 7A-7B include graphs showing the simulation results computed for the CDD and RHD models. Graphs 700 and 710 show simulated current waveforms and variation of voltage MAPE between RHD and CDD. Graphs 720-750 show the voltage and percent error using various RHD horizon lengths compared with the CDD output. As can be seen from the graph 710, the approximation error decreases to zero as the horizon length approaches the data length of 300 s. It is also to be noted that the sawtooth wave is approximated more accurately than current steps. This suggests that the RHD model is slightly more suited to inputs with constant non-zero gradients, which is often the case in real systems. Approximation error is small regardless of the input. Rather than require the entire current input to be known a posteriori, the RHD model only requires two samples of the input and a fixed number of states for a highly accurate discrete-recursive approximation of convolution-based modeling.

Figures 8A, 8B, 8C:
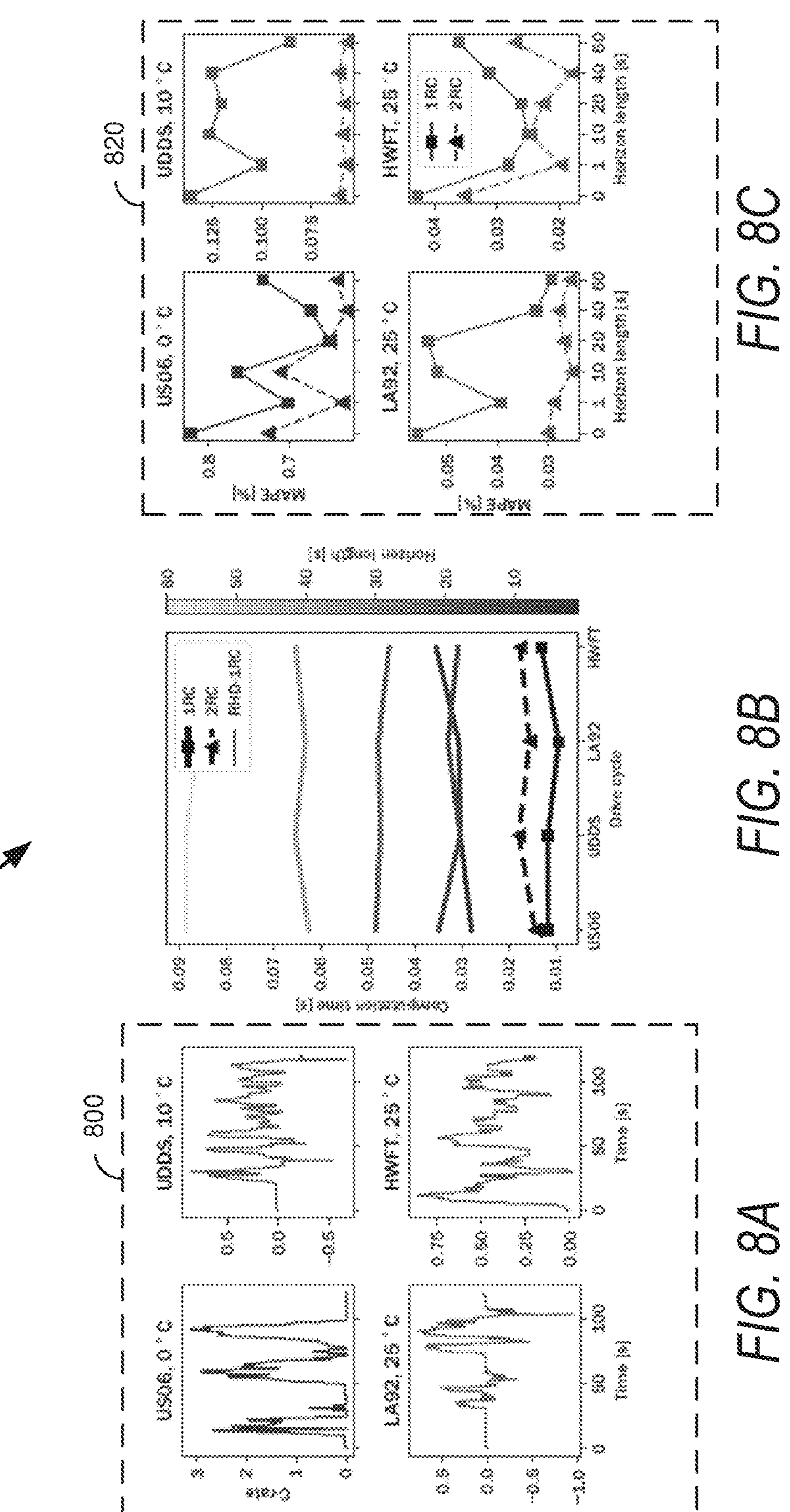
FIGS. 8A-8C include graphs comparing the performance results for the RHD model versus NRC models.

Experimental drive cycle data is used to compare real-time RHD model performance to that of conventional NRC models. The C-rates for four distinct 2-minute drive cycles (US06, urban dynamometer driving schedule (UDDS), LA92, and highway fuel economy test (HWFT)), applied at {0, 10, 25}° C. are shown in graph grouping 800 of FIG. 8A.

Computation time and MAPE of the RHD model are assessed using the various datasets. Results for computation time and error using the drivecycles are shown in graph 810 of FIG. 8B. RHD models have higher computation time due to the larger state vector, but computation time is traded-off for accuracy, as shown graph group 820 of FIG. 8C. When the RHD model is used (indicated by non-zero horizon-length), the MAPE is consistently lower than or bounded by the NRC (0-horizon) error. This shows that the proposed diffusion element increases modelling accuracy. The exact improvement is most easily observed for the 1 RC-pair models, and is data-dependent. For the lower current cycles, UDDS and LA92, error decreases with the horizon length. In contrast, the optimal horizon length for US06 and HWFT cycles is around 40 s. This could reflect real-life LIE diffusion processes, which have time-constants of similar orders.

Figure 9:
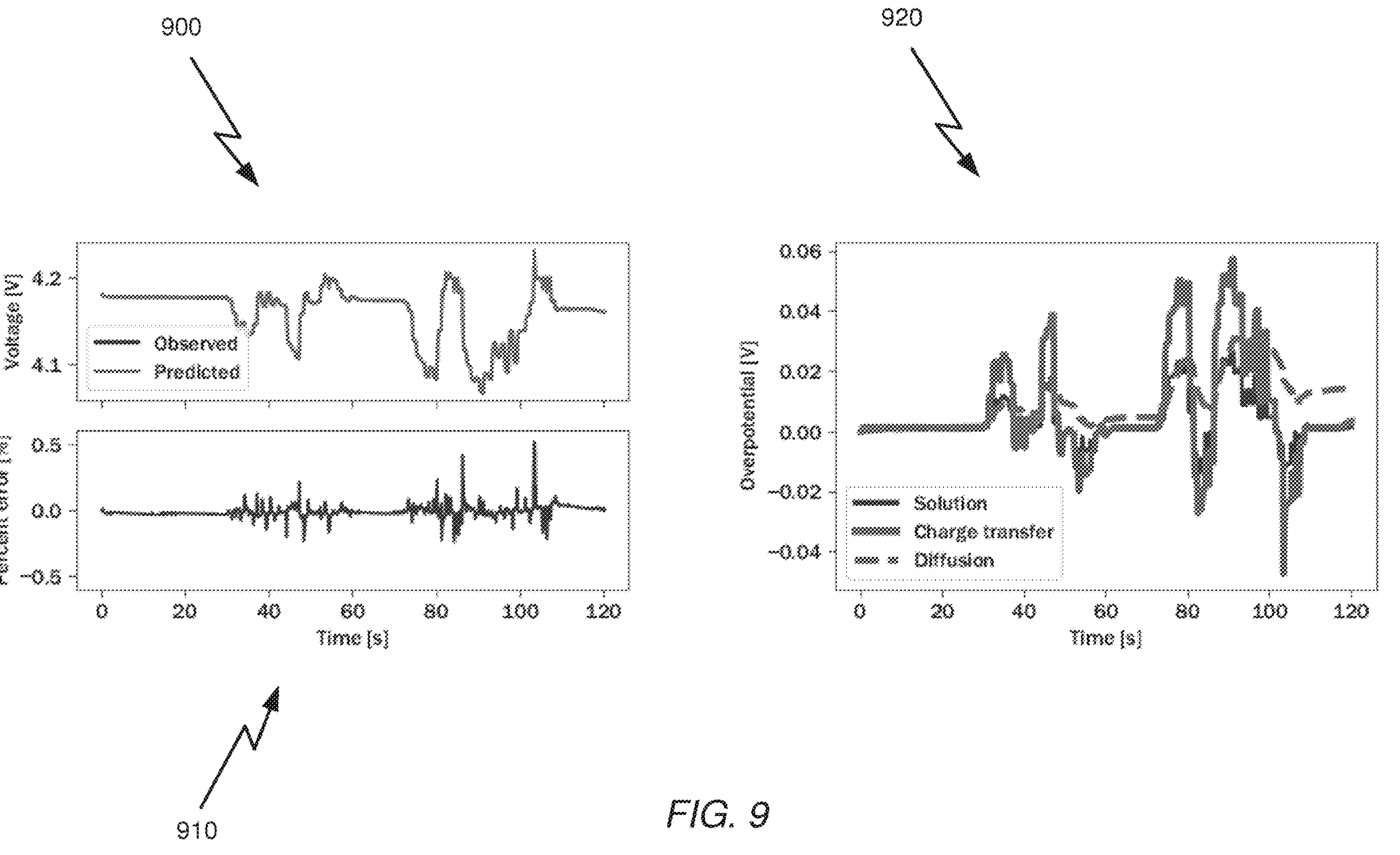
FIG. 9 includes graphs providing results of overpotential analysis using the LA92 drive cycles.

The second use of drive cycle data is for tracking overpotentials. Results of overpotential analysis using the LA92 drive cycles are shown in FIG. 9 for the RHD-1RC with a 20 s horizon. Graphs 900 and 910 show the voltage prediction using the RHD model, and the percent error, respectively. As can be seen, the maximum error is less than 0.51%. Graph 920 provides variation of overpotential over time. The overpotentials are easily disaggregated from the predicted voltage, showing that different electro-chemical processes (solution, charge transfer, and diffusion) dominate at different times.

Thus, as discussed above, and as demonstrated in the various simulations and experimentations, a novel ECM, referred to as the CDD model, was shown to capture the diffusion overpotential in LIB cells using convolution. For real-time implementation, the RHD model was formulated with a linear discrete-time recursive state-space system. This is believed to the first linear representation of diffusion to use a single modelling parameter without fractional-order computations. Verification using simulated and experimental data showed that the RHD model is fast, accurate, and general-purpose compared to standard RC-pair circuits. It can be easily adapted to existing BMS state estimation techniques such as Kalman filters to offer further insight into battery degradation. The proposed framework can be used in wider operating range than that demonstrated herein, and with higher optimization of the state-space system. More extreme temperatures and current rates can be used. Sub-sampling techniques could also be used to reduce the size of the diffusion state vector. Finally, the RHD model can be integrated with advanced diagnostics in a real electrical vehicle (EV), or in a grid system (as will be discussed below).

Figure 10:
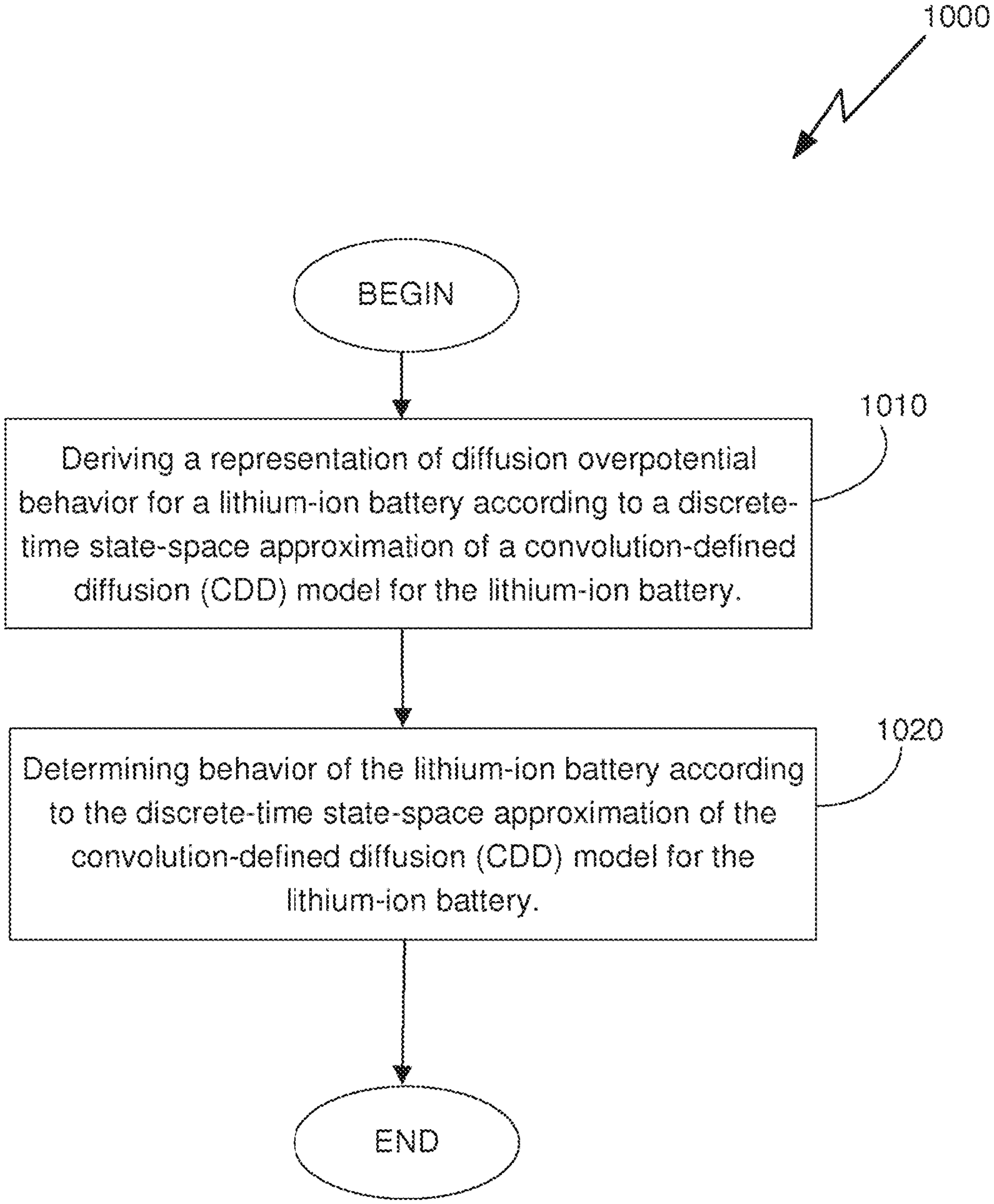
FIG. 10 is a flowchart of an example procedure for monitoring and managing battery performance.

With reference next to FIG. 10, a flowchart of an example procedure 1000 for monitoring and managing battery performance is shown. The procedure 1000 includes deriving 1010 a representation of diffusion overpotential behavior for a lithium-ion battery according to a discrete-time state-space approximation of a convolution-defined diffusion (CDD) model for the lithium-ion battery, and determining 1020 behavior of the lithium-ion battery according to the discrete-time state-space approximation of the convolution-defined diffusion (CDD) model for the lithium-ion battery.

In some examples, determining the behavior of the lithium-ion battery may include applying input current to the lithium-ion battery, capturing voltage response of the lithium-ion battery resulting from applying the input current, and determining diffusion overpotential for the lithium-ion battery based on analysis of the voltage response according to the to the discrete-time state-space approximation of the convolution-defined diffusion (CDD) model. Deriving the representation of the diffusion overpotential behavior may include deriving the discrete-time state-space approximation based on a recursive formulation using diffusion state data computed by the model extending back to a pre-determined number of instances defining a finite time horizon. In various examples, deriving the representation of the diffusion overpotential behavior may include deriving a diffusion related constant, $A_D$, at steady state for the lithium-ion battery, with the lithium-ion battery comprising a nickel-manganese cobalt (NMC) cell, according to:

$$A_D = \frac{2\beta v_M}{SF\sqrt{D\pi}}$$

where $1/\beta$ is the maximum stoichiometric added lithium, $v_M$ is the molar volume of the NMC cell, S is the active surface area, F is Faraday's constant, and D is the Lithium-ion diffusion coefficient.

In some embodiments, deriving the representation of the diffusion overpotential behavior may include determining the CDD model representing the diffusion overpotential behavior of the lithium-ion battery as the product of a diffusion related constant $A_D$, and a convolution of a unit impulse response, $g_z(t)$, with a time-dependent diffusion state amplitude, $\xi$ for the lithium-ion battery according to $V_D(t)=A_D\xi(t)*g_z(t)$, with the time-dependent diffusion state amplitude, $\xi$, being determined based on a step change $\Delta I$ and a gradient of the open-circuit voltage (OCV) curve for the lithium-ion battery, given by $\xi_n(t)=\Delta I(t_n)\nabla V_{OC}\sqrt{t-t_n}$, and with $g_z(t)$ being defined as $g_z(t)=\sqrt{t}-\sqrt{t-\Delta t}$. In such embodiments, the procedure may further include deriving the discrete-time state-space approximation according to a recursive relationship represented as:

$$x_v(t_{k+1}) = A_v x_v(t_k)+B_v u_v(t_k)$$

$$V_D(t_k) = C_v x_v(t_k)$$

where $x_v(t_k)$ is a diffusion state vector comprising diffusion state samples, $u_v(t_k)$ is an input current vector applied to the lithium-ion battery, $C_v$ is a vector with values depending on a diffusion related constant $A_D$, $A_v$ is a matrix with values depending on a relative sampling time for state samples of the discrete-time state-space model, and $B_v$ is a row vector with an entry that depends on an OCV gradient and differential current applied to the discrete-time state-space model.

Deriving the discrete-time state-space approximation according to the recursive relationship may include computing the diffusion overpotential $V_D$ based on a current diffusion state sample and M preceding diffusion state samples, where M is a pre-determined tunable value defining a computational horizon. Computing the diffusion overpotential $V_D$ may include weighing the diffusion states samples arranged in $x_v(t_k)$ with diminishing weights, specified by the matrix $A_v$, to decrease the contribution of earlier computed diffusion states. The non-zero diminishing weights specified in the matrix $A_v$ may be computed according to $$a_m = \sqrt{1+\frac{1}{m}},$$

where m=1, 2, . . . , M, where M represents the number of samples in a computational horizon for computing the diffusion overpotential $V_D$.

In some examples, the procedure may further include deriving based on the discrete-time state-space approximation one or more battery performance metrics and/or battery degradation data. In such examples, the procedure may further include determining based on the battery degradation data one or more of, for example, state of health (SoH) of the lithium-ion battery, and/or state of charge (SoC) for the lithium-ion battery.

The use of the proposed RHD framework described herein to manage performance of cells (lithium-ion batteries in the specific examples described herein, although the techniques can be similarly applied to other types of cells) can be used in relation to various applications that use rechargeable cells, including grid-connected solar-photovoltaic (PV) PV batteries, electrical vehicle batteries, etc. To illustrate how the RHD framework can be used in practical applications, consider the example of managing a PV battery.

Figure 11:
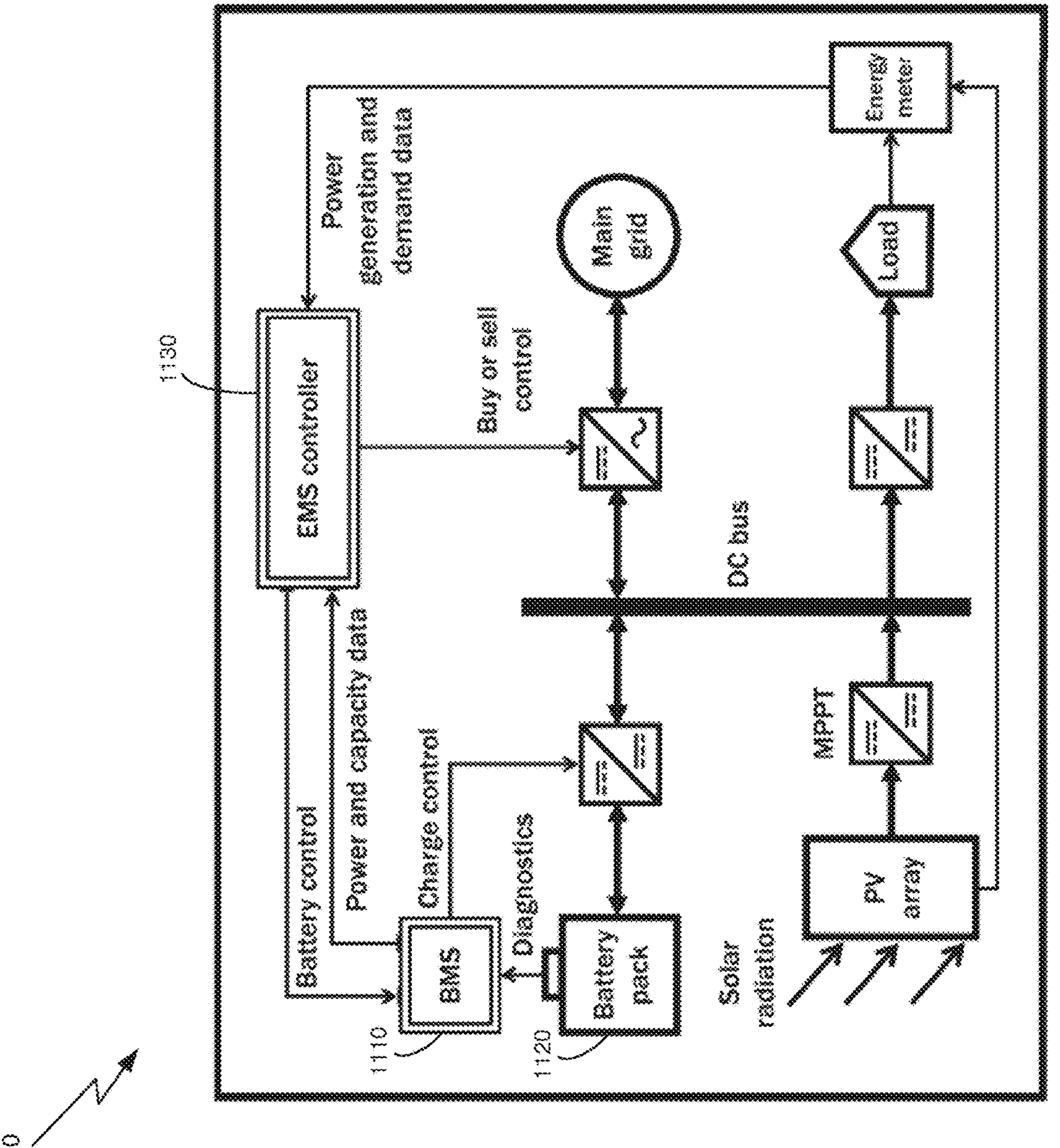
FIG. 11 is a microgrid system diagram showing energy flows, and components, such as a battery management system (BMS), to manage and monitor the performance of a battery pack.

Solar photovoltaics (PV) and lithium-ion batteries (LIB) are dominant technologies with falling costs and more installations. Renewable sources like PV, however, suffer from decentralized generation and intermittency. Grid-connected PV-battery microgrids are illustrated in FIG. 11, showing a microgrid system diagram 1100 depicting energy flows and components such as a battery management system (BMS) 1110 to manage and monitor the performance of a battery pack (such as battery pack 1120). Microgrids energy management systems (EMS), such as an EMS controller 1130 depicted in FIG. 11, need to determine the energy flow that will minimize the overall cost to the user or society. The EMS controls, among other things, battery charge scheduling, PV power export, and grid power imports. Various EMS strategies have been developed. Simple rule-based methods include load-levelling (LL) or self-consumption maximization, where the battery is used to store as much PV power as possible. More advanced model-based methods use load and weather forecasting to perform peak shifting (PKS) or time-of-use arbitrage, which draws grid power during cheaper periods to avoid power use during the peak. Model predictive control (MPC) is a popular centralized model-based EMS that can manage multiple constraints over dynamic time periods. An MPC-based EMS determines the optimal control signals for a given future time horizon at each instance of optimization. Horizons can last from a few minutes to several hours or days. At the component level, MPC ensures that the load power demand and safe operation constraints are always met. At the grid level, MPC minimizes the total operating cost based on predicted energy flows over the horizon. Optimization variables may include the battery charging rate and duration, grid use, or PV market participation. MPC has been used in numerous studies, but it remains unclear whether it is always more cost-effective than a simpler EMS, or only in specific conditions.

To better understand the effects of different EMS strategies on system performance, three EMS frameworks are considered. Real data is used to simulate system performance using LL, PKS, and MPC EMS, representing increasing levels of sophistication. Costs from the grid, battery degradation, and PV credit are derived and assessed using different assumptions. The RHD overpotential ECM, discussed herein, is used to simulate the LIB cells. It can be shown that the benefits of the MPC EMS relative to LL or PKS depends on costing and modelling assumptions.

PV power generation is proportional to the solar irradiation $P_{sun}$[$Wm^{-2}$] received by a PV panel. The array is modelled from the cell level using:

$$I = I_p - I_s\left(e^{\frac{V}{nV_T}} - 1\right) - \frac{V}{R_{sh}} \tag{28}$$

where I is the cell current, V is the cell voltage, $I_p$ is photocurrent (determined by $P_{sun}$), Is is diode saturation current, $V_T$ is the diode thermal voltage, $R_{sh}$ is shunt resistance, and n is the diode ideality factor. Series resistance is assumed negligible. A four-panel array with area 4 $m^2$, $N_s$=60 cells per string, and $N_p$=8 parallel branches (2 branches per panel). Assume the cells are identical and operate in identical conditions, the array current and voltage are given by $I_{array}=N_pI$ and $V_{array}=N_sV$. A DC-DC converter may be used to control the cell voltage to obtain the maximum-power-point (MPP). Assume that the converter is lossless and that the PV system achieves MPP within one sampling interval.

The EMS uses the RHD model described herein (which links diffusivity with battery state of health) to model the battery. An overpotential ECM links diffusivity with battery state of health. The terminal voltage is given by:

$$v(t_k) = V_{OC}(z, t_k) - V_s(t_k) - V_{ct}(t_k) - V_D(t_k) \tag{29}$$

where $V_{OC}$ is the open-circuit voltage (OCV), $z(t_k)$ is the cell state of charge (SoC), $t_k$ is the time at step k, and $V_s$, $V_{ct}$, and $V_D$ are the solution, charge transfer, and diffusion overpotentials. Standard NRC equations govern $V_s$ and $V_{ct}$ as follows:

$$x_\ell(t_{k+1}) = \left(e^{\frac{\Delta t}{R_1C_1}}\right)x_\ell(t_k) + \left(1 - e^{\frac{\Delta t}{R_1C_1}}\right)i(t_k) \tag{30}$$

$$V_{ct}(t_k) = R_1x_\ell(t_k),\ V_s(t_k) = R_0i(t_k)$$

with resistances $R_0$ and $R_1$, capacitance $C_1$, and sampling interval Δt. Note that each variable is a real integer when only 1 RC-pair is used.

The diffusion overpotential is defined according to the RHD model, discussed above, using recursive matrix relationship, with M=2 (in this example):

$$x_v(t_{k+1}) = A_vx_v(t_k) + B_vu_v(t_k) \tag{31}$$

$$V_D(t_k) = C_vx_v(t_k)$$

where the matrix $A_v$ (whose dimensions is +2, which for M=2 is 4)

$$A_v = \begin{pmatrix} 1 & \sqrt{1.5} & 0 & 0 \\ 0 & 0 & \sqrt{2} & 0 \\ 0 & 0 & 0 & \sqrt{2} \\ 0 & 0 & 0 & 0 \end{pmatrix} \tag{32}$$

-continued $$B_v = \frac{dV_{OC}(t_k)}{dz}\sqrt{\Delta t}\begin{pmatrix} 0 & 0 \\ 0 & 0 \\ 0 & 0 \\ 1 & -1 \end{pmatrix}$$

$$C_v = A_D(1\ \ 1\ \ 1\ \ 1)$$

where $x_v \in R^{M+2}$ is a column vector, $A_v(k)$ is a sparse square matrix with elements on the superdiagonal, $B_v$ is a tall sparse matrix with M+2 rows and 2 columns, $C_v$ is a row vector, and $A_D$ is the diffusion constant.

Given a power demand P(t), the current and voltage must meet the demand at each time step, $P(t_k)=i(t_k)v(t_k)$. Since the current input lags the state update vectors by one (1) step, Equations (29)-(32) are substituted into the P(t) expression to obtain current from the quadratic equation:

$$i(t_k) = \frac{-V_{st} + \sqrt{V_{st}^2 - 4R_0P(t_k)}}{-2R_0} \tag{33}$$

where $V_{st}$ is defined as $V_{st}=V_{OC}(t_k)-V_{ct}(t_k)-V_D(t_k)$.

During discharge, $V^2st>4R_0P(t_k)$ for the equation to yield a real value. This reflects the maximum power transfer limit. During charge, P<0 so the argument of the square root is always positive.

Battery degradation is modelled using simplified solid-electrolyte interface (SEI) layer dynamics at the negative electrode (NE), assumed to be the dominant degradation mechanism. This growth is quantified with a 'side-reaction' flux $j_s(t_k)$ that does not contribute to intercalation mechanism. By assuming SEI formation dominance, side-reaction flux becomes directly proportional to the degradation rate. Total capacity $Q_T(t_k)$ is then calculated using:

$$Q_T(t_k) = Q_T(t_{k-1}) + a_n A_{ne} \ell_{ne} F \Delta t j_s(t_k) \tag{34}$$

which shows degradation is exacerbated by high SoC and charging current.

The equations governing the evolution of parameters with state of health (SoH) are given by:

$$R_0 = 0.25\Delta SoH + 0.05 \quad R_1 = 0.45SoH + 0.01 \tag{35}$$

$$C_1 = 300 \cdot 10^{2.301\Delta SoH} \quad A_D = \sqrt{e^{-(23-35\Delta SoH)}}$$

where, $$\Delta SoH(t_k) = 1 - \frac{Q_T(t_k)}{Q_T(0)} \tag{36}$$

In the battery pack, it is assumed that all cells are identical, $N_s$=60 cells per series module, and $N_p$=14 branches in parallel so the pack voltage and current are given by $v_{pack}=N_s v$ and $i_{pack}=N_p i$. Nominal pack voltage is $$V_{pack}^{nom} = 50\text{ V}.$$

Nominal cell voltage $$V_{cell}^{nom} = 3.6\text{ V}$$

is based on INR18650-20R characteristics. Nominal pack capacity $$Q_{pack}^{nom} = 10\text{ kWh}$$

is comparable to average battery pack size in a residential household. Cell charging currents are limited to 3 A, discharge currents are limited by the load demand, and SoC is limited to the range [0.05, 0.95].

Using the above PV array modeling, which relied, in part, on the RHD-based modeling for the cells of the PV array (and without getting into the details of the specific performance of the various EMS control strategies), the PV array, battery overpotentials, and battery degradation were simulated. Costs were derived using market-based analysis. The LL, PKS, and an original MPC EMS control strategies were formulated to understand the variation of net costs with a wide variety of simulation parameters. It was determined that model-based EMS strategies were not necessarily superior to simple rule-based EMS if degradation costs were too high or the PV credit rates were too low. Still, the MPC EMS strategy delivered the most consistent results at the lowest costs.

Performing the various techniques and operations described herein may be facilitated by a controller device (e.g., a processor-based computing device). Such a controller device may include a processor-based device such as a computing device, and so forth, that typically includes a central processor unit or a processing core. The device may also include one or more dedicated learning machines (e.g., neural networks) that may be part of the CPU or processing core. In addition to the CPU, the system includes main memory, cache memory and bus interface circuits. The controller device may include a mass storage element, such as a hard drive (solid state hard drive, or other types of hard drive), or flash drive associated with the computer system. The controller device may further include a keyboard, or keypad, or some other user input interface, and a monitor, e.g., an LCD (liquid crystal display) monitor, that may be placed where a user can access them.

The controller device is configured to facilitate, for example, battery performance monitoring and management (e.g., based on discrete-time state-space overpotential models). The storage device may thus include a computer program product that when executed on the controller device (which, as noted, may be a processor-based device) causes the processor-based device to perform operations to facilitate the implementation of procedures and operations described herein. The controller device may further include peripheral devices to enable input/output functionality. Such peripheral devices may include, for example, flash drive (e.g., a removable flash drive), or a network connection (e.g., implemented using a USB port and/or a wireless transceiver), for downloading related content to the connected system. Such peripheral devices may also be used for downloading software containing computer instructions to enable general operation of the respective system/device. Alternatively and/or additionally, in some embodiments, special purpose logic circuitry, e.g., an FPGA (field programmable gate array), an ASIC (application-specific integrated circuit), a DSP processor, a graphics processing unit (GPU), application processing unit (APU), etc., may be used in the implementations of the controller device. Other modules that may be included with the controller device may include a user interface to provide or receive input and output data. The controller device may include an operating system.

Computer programs (also known as programs, software, software applications or code) include machine instructions for a programmable processor, and may be implemented in a high-level procedural and/or object-oriented programming language, and/or in assembly/machine language. As used herein, the term "machine-readable medium" refers to any non-transitory computer program product, apparatus and/or device (e.g., magnetic discs, optical disks, memory, Programmable Logic Devices (PLDs)) used to provide machine instructions and/or data to a programmable processor, including a non-transitory machine-readable medium that receives machine instructions as a machine-readable signal.

In some embodiments, any suitable computer readable media can be used for storing instructions for performing the processes/operations/procedures described herein. For example, in some embodiments computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only Memory (EEPROM), etc.), any suitable media that is not fleeting or not devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

Although particular embodiments have been disclosed herein in detail, this has been done by way of example for purposes of illustration only, and is not intended to be limiting with respect to the scope of the appended claims, which follow. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

What is claimed is:

1. A method for monitoring and managing battery performance comprising:

deriving a battery health model for a lithium-ion battery based on overpotential behavior of the lithium-ion battery caused by diffusion dynamics in the lithium-ion battery, wherein the overpotential behavior caused by diffusion dynamics is modeled according to a discrete-time state-space approximation of a convolution-defined diffusion (CDD) model for the lithium-ion battery representing diffusion states in the lithium-ion battery; and determining behavior of the lithium-ion battery, including battery degradation, according to the discrete-time state-space approximation of the convolution-defined diffusion (CDD) model for the lithium-ion battery representing the diffusion states in the lithium-ion battery.

2. The method of claim 1, wherein determining the behavior of the lithium-ion battery comprises:

applying input current to the lithium-ion battery;

capturing voltage response of the lithium-ion battery resulting from applying the input current; and determining the overpotential behavior of the lithium-ion battery caused by diffusion dynamics based on analysis of the voltage response according to the discrete-time state-space approximation of the convolution-defined diffusion (CDD) model.

3. The method of claim 1, wherein deriving the representation of the overpotential behavior caused by diffusion dynamics comprises:

deriving the discrete-time state-space approximation based on a recursive formulation using diffusion state data computed by the model extending back to a pre-determined number of instances defining a finite time horizon.

4. The method of claim 1, wherein deriving the representation of the overpotential behavior caused by diffusion dynamics comprises:

deriving a diffusion related constant, $A_D$, at steady state for the lithium-ion battery, with the lithium-ion battery comprising a nickel-manganese cobalt (NMC) cell, according to:

$$A_D = \frac{2\beta v_M}{SF\sqrt{D\pi}}$$

where $1/\beta$ is the maximum stoichiometric added lithium, $v_M$ is the molar volume of the NMC cell, S is the active surface area, F is Faraday's constant, and D is the Lithium-ion diffusion coefficient.

5. The method of claim 1, wherein deriving the representation of the overpotential behavior caused by diffusion dynamics comprises:

determining the CDD model representing the overpotential behavior caused by diffusion dynamics in the lithium-ion battery as the product of a diffusion related constant $A_D$, and a convolution of a unit impulse response, $g_z(t)$, with a time-dependent diffusion state amplitude, $\zeta$, for the lithium-ion battery according to:

$$V_D(t) = A_D\zeta(t) * g_z(t),$$

wherein the time-dependent diffusion state amplitude, $\zeta$, is determined based on a step change $\Delta I$ and a gradient of the open-circuit voltage (OCV) curve for the lithium-ion battery, given by:

$$\zeta_n(t) = \Delta I(t_n)\nabla V_{OC}\sqrt{t - t_n},$$

and wherein $g_z(t)$ is defined as $g_z(t)=\sqrt{t}-\sqrt{t-\Delta t}$.

6. The method of claim 5, further comprising:

deriving the discrete-time state-space approximation according to a recursive relationship represented as:

$$x_v(t_{k+1}) = A_v x_v(t_k) + B_v u_v(t_k)$$

$$V_D(t_k) = C_v x_v(t_k)$$

where $x_v(t_k)$ is a diffusion state vector comprising diffusion state samples, $u_v(t_k)$ is an input current vector applied to the lithium-ion battery, $C_v$ is a vector with values depending on a diffusion related constant $A_D$, $A_v$ is a matrix with values depending on a relative sampling time for state samples of the discrete-time state-space model, and $B_v$ is a row vector with an entry that depends on an OCV gradient and differential current applied to the discrete-time state-space model.

7. The method of claim 6, wherein deriving the discrete-time state-space approximation according to the recursive relationship comprises:

computing the diffusion overpotential $V_D$ based on a current diffusion state sample and M preceding diffusion state samples, where M is a pre-determined tunable value defining a computational horizon.

8. The method of claim 6, wherein computing the diffusion overpotential $V_D$ comprises:

weighing the diffusion states samples arranged in $x_v(t_k)$ with diminishing weights, specified by the matrix $A_v$, to decrease the contribution of earlier computed diffusion states.

9. The method of claim 8, wherein the non-zero diminishing weights specified in the matrix $A_v$ are computed according to $$a_m = \sqrt{1 + \frac{1}{m}},$$

where m=1, 2, . . . , M, where M represents the number of samples in a computational horizon for computing the diffusion overpotential $V_D$.

10. The method of claim 1, further comprising:

deriving based on the discrete-time state-space approximation one or more battery performance metrics and/or battery degradation data.

11. The method of claim 10, further comprising:

determining based on the battery degradation data one or more of: state of health (SoH) of the lithium-ion battery, or state of charge (SoC) for the lithium-ion battery.

12. The method of claim 1, wherein deriving the battery health model based on overpotential behavior of the lithium-ion battery caused by diffusion dynamics comprises:

deriving the overpotential behavior caused by diffusion dynamics according to the discrete-time state-space CDD module representing the diffusion states in the lithium-ion battery using a diffusion constant, $A_D$, determined based on characteristics of the lithium-ion battery and representative of diffusion behavior for a discrete number of current step changes, combined with a circuit model for the lithium-ion battery comprising a resistor in series with N pairs of resistors and capacitors in parallel, with N>2.

13. A battery performance monitoring and management system comprising:

one or more memory storage devices to store data and executable instructions; and a processor-based controller, coupled to the one or more memory storage devices, configured to:

derive a battery health model for a lithium-ion battery based on overpotential behavior of the lithium-ion battery caused by diffusion dynamics in the lithium-ion battery, wherein the overpotential behavior caused by diffusion dynamics is modeled according to a discrete-time state-space approximation of a convolution-defined diffusion (CDD) model for the lithium-ion battery representing diffusion states in the lithium-ion battery; and determine behavior of the lithium-ion battery, including battery degradation, according to the discrete-time state-space approximation of the convolution-defined diffusion (CDD) model for the lithium-ion battery representing the diffusion states in the lithium-ion battery.

14. The system of claim 13, wherein the processor-based controller configured to determine the behavior of the lithium-ion battery is configured to:

apply input current to the lithium-ion battery;

capture voltage response of the lithium-ion battery resulting from applying the input current; and determine the overpotential behavior of the lithium-ion battery caused by diffusion dynamics based on analysis of the voltage response according to the discrete-time state-space approximation of the convolution-defined diffusion (CDD) model.

15. The system of claim 13, wherein the processor-based controller configured to derive the representation of the overpotential behavior caused by diffusion dynamics is configured to:

derive the discrete-time state-space approximation based on a recursive formulation using diffusion state data computed by the model extending back to a pre-determined number of instances defining a finite time horizon.

16. The system of claim 13, wherein the processor-based controller configured to derive the representation of the overpotential behavior caused by diffusion dynamics is configured to:

derive a diffusion related constant, Ap, at steady state for the lithium-ion battery, with the lithium-ion battery comprising a nickel-manganese cobalt (NMC) cell, according to:

$$A_D = \frac{2\beta v_M}{SF\sqrt{D\pi}}$$

where 1/β is the maximum stoichiometric added lithium, $v_M$ is the molar volume of the NMC cell, S is the active surface area, F is Faraday's constant, and D is the Lithium-ion diffusion coefficient.

17. The system of claim 13, wherein the processor-based controller configured to derive the representation of the overpotential behavior caused by diffusion dynamics comprises:

determine the CDD model representing the diffusion overpotential behavior of the lithium-ion battery as the product of a diffusion related constant $A_D$, and a convolution of a unit impulse response, $g_z(t)$, with a time-dependent diffusion state amplitude, ξ, for the lithium-ion battery according to:

$$V_D(t) = A_D\zeta(t) * g_z(t),$$

wherein the time-dependent diffusion state amplitude, ξ, is determined based on a step change ΔI and a gradient of the open-circuit voltage (OCV) curve for the lithium-ion battery, given by:

$$\zeta_n(t) = \Delta I(t_n)\nabla V_{OC}\sqrt{t - t_n},$$

and wherein $g_z(t)$ is defined as $g_z(t)=\sqrt{t}-\sqrt{t-\Delta t}$.

18. The system of claim 17, wherein the processor-based controller is further configured to:

derive the discrete-time state-space approximation according to a recursive relationship represented as:

$$x_v(t_{k+1}) = A_v x_v(t_k) + B_v u_v(t_k)$$
$$V_D(t_k) = C_v x_v(t_k)$$

where $x_v(t_k)$ is a diffusion state vector comprising diffusion state samples, $u_v(t_k)$ is an input current vector applied to the lithium-ion battery, $C_v$ is a vector with values depending on a diffusion related constant $A_D$, $A_v$ is a matrix with values depending on a relative sampling time for state samples of the discrete-time state-space model, and $B_v$ is a row vector with an entry that depends on an OCV gradient and differential current applied to the discrete-time state-space model.

19. The system of claim 18, wherein the processor-based controller configured to derive the discrete-time state-space approximation according to the recursive relationship is configured to:

compute the diffusion overpotential $V_D$ based on a current diffusion state sample and M preceding diffusion state samples, where M is a pre-determined tunable value defining a computational horizon.

20. The system of claim 18, wherein the processor-based controller configured to compute the diffusion overpotential $V_D$ is configured to:

weigh the diffusion states samples arranged in $x_v(t_k)$ with diminishing weights, specified by the matrix $A_v$, to decrease the contribution of earlier computed diffusion states;

wherein the non-zero diminishing weights specified in the matrix $A_v$ are computed according to $$a_m = \sqrt{1 + \frac{1}{m}},$$

where m=1, 2, . . . , M, where M represents the number of samples in a computational horizon for computing the diffusion overpotential $V_D$.

21. A non-transitory computer readable media comprising computer instructions executable on a processor-based device to:

derive a battery health model for a lithium-ion battery based on overpotential behavior of the lithium-ion battery caused by diffusion dynamics in the lithium-ion battery, wherein the overpotential behavior caused by diffusion dynamics is modeled according to a discrete-time state-space approximation of a convolution-defined diffusion (CDD) model for the lithium-ion battery representing diffusion states in the lithium-ion battery; and determine behavior of the lithium-ion battery, including battery degradation, according to the discrete-time state-space approximation of the convolution-defined diffusion (CDD) model for the lithium-ion battery representing the diffusion states in the lithium-ion battery.

* * * * *